United States Patent
Li et al.

(10) Patent No.: US 10,490,328 B2
(45) Date of Patent: Nov. 26, 2019

(54) ROLLED-UP POWER INDUCTOR AND ARRAY OF ROLLED-UP POWER INDUCTORS FOR ON-CHIP APPLICATIONS

(71) Applicant: The Board of Trustees of the University of Illinois, Urbana, IL (US)

(72) Inventors: Xiuling Li, Champaign, IL (US); Wen Huang, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 104 days.

(21) Appl. No.: 15/704,262

(22) Filed: Sep. 14, 2017

(65) Prior Publication Data
US 2018/0075956 A1 Mar. 15, 2018

Related U.S. Application Data

(60) Provisional application No. 62/394,775, filed on Sep. 15, 2016.

(51) Int. Cl.
*H01F 5/00* (2006.01)
*H01F 5/04* (2006.01)
(Continued)

(52) U.S. Cl.
CPC .............. *H01F 5/003* (2013.01); *H01F 5/04* (2013.01); *H01F 17/0006* (2013.01);
(Continued)

(58) Field of Classification Search
USPC ........................................................ 336/200
See application file for complete search history.

(56) References Cited

U.S. PATENT DOCUMENTS 3,247,476 A 4/1966 Pintell
3,560,904 A * 2/1971 Wilkes ..................... H01B 7/08
336/180
(Continued)

FOREIGN PATENT DOCUMENTS

EP 2 423 162 A1 2/2012
WO WO 2008/148413 A1 12/2008
WO WO 2016/031076 A1 3/2016

OTHER PUBLICATIONS

Ali, M.S. Mohamed et al., "Out-of-plane spiral-coil inductor self-assembled by locally controlled bimorph actuation," *Micro & Nano Letters*, 6, 12 (2011) pp. 1016-1018.
(Continued)

*Primary Examiner* — Ronald Hinson
(74) *Attorney, Agent, or Firm* — Brinks Gilson & Lione

(57) ABSTRACT

An array of rolled-up power inductors for on-chip applications comprises at least two rolled-up power inductors connected in series and formed from a stack of multilayer sheets. The array includes a first rolled-up power inductor comprising a first multilayer sheet in a rolled configuration about a first longitudinal axis and second rolled-up power inductor comprising a second multilayer sheet in a rolled configuration about a second longitudinal axis. The first and second rolled-up power inductors are laterally spaced apart. The first multilayer sheet comprises a first patterned conductive layer on a first strain-relieved layer, and the second multilayer sheet comprises a second patterned conductive layer on a second strain-relieved layer. Prior to roll-up of the second and first multilayer sheets, the second multilayer sheet is disposed on the first multilayer sheet, and a through-thickness first via connects the second patterned conductive layer with the first patterned conductive layer.

13 Claims, 13 Drawing Sheets

(51) Int. Cl.
H01L 49/02 (2006.01)
H01F 17/00 (2006.01)
H01F 17/02 (2006.01)

(52) U.S. Cl.
CPC ............. H01F 17/02 (2013.01); H01L 28/10 (2013.01); H01F 2005/006 (2013.01)

(56) References Cited

U.S. PATENT DOCUMENTS

| | | | |
|---|---|---|---|
| 4,755,783 A | 7/1988 | Fleischer et al. | |
| 5,844,460 A | 12/1998 | Bogdan et al. | |
| 6,183,267 B1 | 2/2001 | Marcus et al. | |
| 6,290,510 B1* | 9/2001 | Fork | B81C 1/00484 257/E23.068 |
| 7,000,315 B2* | 2/2006 | Chua | H01F 17/02 29/874 |
| 7,330,096 B2* | 2/2008 | Shah | H01F 37/005 336/213 |
| 7,517,769 B2* | 4/2009 | Van Schuylenbergh | H01G 5/18 257/532 |
| 7,707,714 B2 | 5/2010 | Schmidt et al. | |
| 7,710,232 B1 | 5/2010 | Stalford et al. | |
| 7,733,205 B2 | 6/2010 | Hyvönen | |
| 8,679,888 B2 | 3/2014 | Rogers et al. | |
| 9,224,532 B2 | 12/2015 | Li et al. | |
| 2010/0019868 A1 | 1/2010 | Hyde et al. | |
| 2012/0181501 A1 | 7/2012 | Sung | |
| 2014/0234977 A1* | 8/2014 | Grimm | H01L 29/66522 436/39 |
| 2014/0246764 A1 | 9/2014 | Li et al. | |
| 2016/0301377 A1 | 10/2016 | Li et al. | |

OTHER PUBLICATIONS

Arco, De et al., "Synthesis, Transfer, and Devices of Single- and Few-Layer Graphene by Chemical Vapor Deposition," *IEEE Transactions on Nanotechnology*, 8, 2 (2009) pp. 135-138.
Arora, William J. et al., "Membrane folding to achieve three-dimensional nanostructures: Nanopatterned silicon nitride folded with stressed chromium hinges," *Applied Physics Letters*, 88, 053108 (2006) pp. 053108-1-053108-3.
Bianucci, P. et al., "Self-Organized 1.55 μm InAs/InP Quantum Dot Tube Nanoscale Coherent Light Sources," *Winter Topicals (WTM) IEEE, Conference Publication* (2010) pp. 127-128.
Bof Bufon, Carlos Cesar et al., "Self-Assembled Ultra-Compact Energy Storage Elements Based on Hybrid Nanomembranes," *Nano Letters*, 10, 7 (2010) pp. 2506-2510.
Bogush, V. et al., "Electroless deposition of novel Ag—W thin films," *Microelectronic Engineering*, 70 (2003) pp. 489-494.
Chen, Daru et al., "A novel low-loss Terahertz waveguide: Polymer tube," *Optics Express*, 18, 4 (2010) pp. 3762-3767.
Chen, X.-D. et al., "High-quality and efficient transfer of large-area graphene films onto different substrates," *Carbon*, 56 (2013) pp. 271-278.
Chun, I.S. et al., "InGaAs/GaAs 3D architecture formation by strain-induced self-rolling with lithographically defined rectangular stripe arrays," *Journal of Crystal Growth*, 310 (2008) pp. 2353-2358.
Chun, Ik Su et al., "Controlled Assembly and Dispersion of Strain-Induced InGaAs/GaAs Nanotubes," *IEEE Transactions on Nanotechnology*, 7, 4 (2008) pp. 493-495.
Chun, Ik Su et al., "Geometry Effect on the Strain-Induced Self-Rolling of Semiconductor Membranes," *Nano Letters*, 10 (2010) pp. 3927-3932.
Dai, L. et al., "Strain-driven self-rolling mechanism for anomalous coiling of multilayer nanohelices," *Journal of Applied Physics*, 106, 114314 (2009) pp. 114314-1-114314-5.
Dai, Lu et al., "Directional scrolling of SiGe/Si/Cr nanoribbon on Si(111) surfaces controlled by two-fold rotational symmetry underetching," *Nanoscale*, 5 (2013) pp. 971-976.

De, Sukanta et al., "Are There Fundamental Limitations on the Sheet Resistance and Transmittance of Thin Graphene Films?" *ACS Nano*, 4, 5 (2010) pp. 2713-2720.
Doerner, Mary F. et al., "Stresses and Deformation Processes in Thin Films on Substrates," *CRC Critical Reviews in a Solid State and Materials Sciences*, 14, 3 (1988) pp. 225-268.
Du, Frank et al., "Aligned arrays of single walled carbon nanotubes for transparent electronics," *Proceedings of SPIE*, 8725 (2013) pp. 87251S-1-87251S-7.
Frankel, Michael Y., "Terahertz Attenuation and Dispersion Characteristics of Coplanar Transmission Lines," *IEEE Transactions on Microwave Theory and Techniques*, 39, 6 (1991), pp. 910-916.
Fukuda, Y. et al., "Planar inductor with ferrite layers for DC-DC converter," *IEEE Transactions on Magnetics*, 39, 4 (2003) pp. 2057-2061.
Gao, X.-Y. et al., "Fabrication of ultralow-profile micromachined inductor with magnetic core material," *IEEE Transactions on Magnetics*, 41 (2005) pp. 4397-4400.
Golod, S. V. et al., "Fabrication of conducting GeSi/Si micro- and nanotubes and helical microcoils," *Semiconductor Science and Technology*, 16 (2001) pp. 181-185.
Golod, S.V. et al., "Freestanding SiGe/Si/Cr and SiGe/Si/Si$_x$N$_y$/Cr Microtubes," *Applied Physics Letters*, 84, 17 (2004) pp. 3391-3393.
Gorin, A. et al., "Fabrication of silicon nitride waveguides for visible-light using PECVD: a study of the effect of plasma frequency on optical properties," *Optics Express*, 16, 18 (2008) pp. 13509-13516.
Harazim, Stefan M. et al., "Fabrication and applications of large arrays of multifunctional rolled-up SiO/SiO$_2$ microtubes," *Journal of Materials Chemistry*, 22, 7 (2012) pp. 2878-2884.
Harburg, D. V. et al., "On-Chip RF Power Inductors With Nanogranular Magnetic Cores Using Prism-Assisted UV-LED Lithography," Transducers & Eurosensors XXVII: The 17th International Conference on Solid-State Sensors, Actuators and Microsystems, Barcelona, 2013, pp. 701-704.
Heiliger, H.-M. et al., "Low-dispersion thin-film microstrip lines with cyclotene (benzocyclobutene) as dielectric medium," *Applied Physics Letters*, 70, 17 (1997) pp. 2233-2235.
Hsu, Heng-Ming et al., "Design of Coil Length of On-Chip Transformer With High Turn Ratio and High Coupling Performance," *IEEE Transactions on Electronic Devices*, 59, 11 (2012), pp. 3061-3068.
Hu, W. et al., "Diamond as an inert substrate of graphene," *The Journal of Chemical Physics*, 138, 5 (2013) p. 054701.
Huang, G. S. et al., "Optical properties of rolled-up tubular microcavities from shaped nanomembranes," *Applied Physics Letters*, 94, 141901 (2009) 141901-1-141901-3.
Huang, Gaoshan et al., "Rolled-up transparent microtubes as two-dimensionally confined culture scaffolds of individual yeast cells," *Lab Chip*, 9 (2009) pp. 263-268.
Huang, Gaoshan et al., "Thinning and Shaping Solid Films into Functional and Integrative Nanomembranes," *Advanced Materials*, 24 (2012) pp. 2517-2546.
Huang, Minghuang et al., "Mechano-electronic Superlattices in Silicon Nanoribbons," *ACS Nano*, 3, 3 (2009) pp. 721-727.
Huang, Minghuang et al., "Nanomechanical Architecture of Strained Bilayer Thin Films: From Design Principles to Experimental Fabrication," *Advanced Materials*, 17 (2005) pp. 2860-2864.
Huang, W. et al., "Precision structural engineering of self-rolled-up 3D nanomembranes guided by transient quasi-static FEM modeling," *Nano Letters*, 14, 11 (2014) pp. 6293-6297.
Huang, Wen et al, "On-Chip Inductors with Self-Rolled-Up SiNx Nanomembrane Tubes: A Novel Design Platform for Extreme Miniaturization", *Nano Letters*, 12 (2012) pp. 6283-6288.
Inberg, A. et al., "Novel Highly Conductive Silver-Tungsten Thin Films Electroless Deposited from Benzoate Solution for Microelectronic Applications," *Journal of the Electrochemical Society*, 150, 5 (2003) pp. C285-C291.
Ishigaki, Tsukasa et al., "Photonic-Crystal Slab for Terahertz-Wave Integrated Circuits," *Photonics Conference (IPC) IEEE, Conference Publication* (2012) pp. 774-775.

(56) References Cited

OTHER PUBLICATIONS

Jan, C.-H. et al., "A 32nm SoC Platform Technology with 2$^{nd}$ Generation High-k/Metal Gate Transistors Optimized for Ultra Low Power, High Performance, and High Density Product Applications," *Electron Devices Meeting (IEDM)*, IEEE International (2009) pp. 647-650.

Jaramillo-Cabanzo, D. F. et al., "Plasma Etching Chemistry for Smoothening of Ultrananocrystalline Diamond Films," *ECS Solid State Letters*, 4, 10 (2015) pp. P80-P84.

Jiang, Hongrui et al., "On-Chip Spiral Inductors Suspended over Deep Copper-Lined Cavities," *IEEE Transactions on Microwave Theory and Techniques*, 48, 12 (2000) pp. 2415-2423.

Kim, K. H. et al., "A megahertz switching DC/DC converter using FeBN thin film inductor," *Magnetics, IEEE Transactions on Magnetics*, 38, 5 (2002) pp. 3162-3164.

Kobayashi, Toshiyuki et al., "Production of a 100-m-long high-quality graphene transparent conductive film by roll-to-roll chemical vapor deposition and transfer process," *Applied Physical Letters*, 102, 023112 (2013) pp. 023112-1-023112-4.

Lee, D. W. et al., "Fabrication and analysis of high-performance integrated solenoid inductor with magnetic core," *IEEE Transactions on Magnetics*, 44, 11 (2008) pp. 4089-4095.

Li, Feng et al., "Coherent emission from ultrathin-walled spiral InGaAs/GaAs quantum dot microtubes," *Optics Letters*, 34, 19 (2009) pp. 2915-2917.

Li, Weizhi et al., "Influences of Process Parameters of Low Frequency PECVD Technology on Intrinsic Stress of Silicon Nitride Thin Film," *Proc. of SPIE*, 7658 (2010) pp. 765824-1-765824-7.

Li, Xiuling, "Self-rolled-up microtube ring resonators: a review of geometrical and resonant properties," *Advances in Optics and Photonics*, 3 (2011) pp. 366-387.

Li, Xiuling, "Strain induced semiconductor nanotubes: from formation process to device applications," *Journal of Physics D: Applied Physics*, 41 (2008) 193001, pp. 1-12.

Li, Xuesong et al., "Transfer of Large-Area Graphene Films for High-Performance Transparent Conductive Electrodes," *Nano Letters*, 9, 12 (2009) pp. 4359-4363.

Logeeswaran, V. J. et al., "Ultrasmooth Silver Thin Films Deposited with a Germanium Nucleation Layer," *Nano Letters*, 9, 1 (2009) pp. 178-182.

Luchnikov, V. et al., "Toroidal hollow-core microcavities produced by self-rolling of strained polymer bilayer films," *Journal of Micromechanics and Microengineering*, 18, 035041 (2008) pp. 1-5.

Luo, J. K. et al., "Modelling and fabrication of low operation temperature microcages with a polymer/metal/DLC trilayer structure," *Sensors and Actuators A*, 132 (2006) pp. 346-353.

Masi, Maurizio et al., "Modeling of Silicon Nitride Deposition by RF Plasma-Enhanced Chemical Vapor Deposition," *Chemical Engineering Science*, 49, 5 (1994) pp. 669-679.

Mei, Yongfeng et al., "Versatile Approach for Integrative and Functionalized Tubes by Strain Engineering of Nanomembranes on Polymers," *Advanced Materials*, 20 (2008) pp. 4085-4090.

Meyer, C. D. et al., "Influence of layer thickness on the performance of stacked thick-film copper air-core power inductors," *Magnetics, IEEE Transactions*, 48 (2012) pp. 4436-4439.

Mi, Zetian et al., "1.3-1.55 μm Self-Organized InAs Quantum Dot Tube Nanoscale Lasers on Silicon," *Photonics Conference (PHO), IEEE, Conference Publication* (2011) pp. 535-536.

Mitrofanov, Oleg et al., "Dielectric-lined cylindrical metallic THz waveguides: mode structure and dispersion," *Optics Express*, 18, 3 (2010) pp. 1898-1903.

Mitrofanov, Oleg et al., "Reducing Transmission Losses in Hollow THz Waveguides," *IEEE Transactions on Terahertz Science and Technology*, 1, 1 (2011) pp. 124-132.

Moiseeva, E. et al., "Single-mask microfabrication of three-dimensional objects from strained bimorphs," *Journal of Micromechanics and Microengineering*, 17 (2007) pp. N63-N68.

Müller, Christian et al., "Tuning giant magnetoresistance in rolled-up Co-Cu nanomembranes by strain engineering," *Nanoscale*, 4 (2012) pp. 7155-7160.

Nguyen, Nhat M. et al., "Si IC-Compatible Inductors and LC Passive Filters," *IEEE Journal of Solid-State Circuits*, 25, 4 (1990) pp. 1028-1031.

Pahlevaninezhad, H. et al., "Advances in Terahertz Waveguides and Sources," *IEEE Photonics Journal*, 3, 2 (2011) pp. 307-310.

Pang, Liang et al., "Transfer printing of flexible hybrid inductor-capacitor filters via pre-etched silicon-on-insulator mother wafer," *Applied Physics Letters*, 101, 063113 (2012) pp. 063113-1-063113-4.

Park, Min et al., "The Detailed Analysis of High Q CMOS-Compatible Microwave Spiral Inductors in Silicon Technology," *IEEE Transactions on Electron Devices*, 45, 9 (1998) pp. 1953-1959.

Parvizian, M. et al., "Residual stress improvement of platinum thin film in Au/Pt/Ti/p-GaAs ohmic contact by RF sputtering power," *Applied Surface Science*, 260 (2012) pp. 77-79.

Prinz, V. Ya. et al., "Free-standing and overgrown InGaAs/GaAs nanotubes, nanohelices and their arrays," *Physica E*, 6 (2000) pp. 828-831.

Regan, W. et al., "A direct transfer of layer-area graphene," *Applied Physics Letters*, 96 (2010) p. 113102.

Rottler, Andreas et al., "Rolled-up nanotechnology for the fabrication of three-dimensional fishnet-type GaAs-metal metamaterials with negative refractive index at near-infrared frequencies," *Applied Physics Letters*, 100, 151104 (2012) pp. 151104-1-151104-4.

Schulze, Sabine et al., "Morphological Differentiation of Neurons on Microtopographic Substrates Fabricated by Rolled-Up Nanotechnology," *Advanced Engineering Materials*, 12, 9 (2010), pp. B558-B6564.

Seidel, H. et al., "Anisotropic Etching of Crystalline Silicon in Alkaline Solutions," *J. Electrochem. Soc.*, 137, 11 (1990) pp. 3612-3632.

Seleznev, V. A. et al., "Generation and Registration of Disturbances in a Gas Flow. 1. Formation of Arrays of Tubular Microheaters and Microsensors," *Journal of Applied Mechanics and Technical Physics*, 50, 2 (2009) pp. 291-296.

Shacham-Diamand, Yosi et al., "Electroless Silver and Silver with Tungsten Thin Films for Microelectronics and Microelectromechanical System Applications," *Journal of the Electrochemical Society*, 147, 9 (2000) pp. 3345-3349.

Shiplyuk, A. N. et al., "Generation and Registration of Disturbances in a Gas Flow. 2. Experiments with Arrays of Tubular Microheaters and Microsensors," *Journal of Applied Mechanics and Technical Physics*, 50, 3 (2009) pp. 454-458.

Smith, Donald L. et al., "Mechanism of $SiN_xH_y$ Deposition from $NH_3$-$SiH_4$ Plasma," *J. Electrochem. Soc.*, 137, 2 (1990) pp. 614-623.

Smith, Elliot J. et al., "Lab-in-a-Tube: Detection of Individual Mouse Cells for Analysis in Flexible Split-Wall Microtube Resonator Sensors," *Nano Letters*, 11 (2011) pp. 4037-4042.

Songmuang, R. et al., "From rolled-up Si microtubes to $SiO_x$/Si optical ring resonators," *Microelectronic Engineering*, 84 (2007) pp. 1427-1430.

Sugawa, Y. et al., "Carbonyl-Iron/Epoxy Composite Magnetic Core for Planar Power Inductor Used in Package-Level Power Grid," *IEEE Transactions on Magnetics*, 49, 7 (2013) pp. 4172-4175.

Sumant, A. et al., "Large-area low-temperature ultrananocrystalline diamond (UNCD) films and integration with CMOS devices for monolithically integrated diamond MEMS/NEMS-CMOS systems," *SPIE Defense, Security, and Sensing*, (2009) pp. 731817-731817-7.

Tang, Chih-Chun et al., "Miniature 3-D Inductors in Standard CMOS Process," *IEEE Journal of Solid-State Circuits*, 37, 4 (2002) pp. 471-480.

Tian, Dongbin et al., "Dual cylindrical metallic grating-cladding polymer hollow waveguide for terahertz transmission with low loss," *Applied Physics Letters*, 97 (2010) pp. 133502-1-133502-3.

Tian, Zhaobing et al., "Controlled Transfer of Single Rolled-Up InGaAs-GaAs Quantum-Dot Microtube Ring Resonators Using Optical Fiber Abrupt Tapers," *IEEE Photonics Technology Letters*, 22, 5 (2010) pp. 311-313.

(56) References Cited

OTHER PUBLICATIONS

Tian, Zhaobing et al., "Single rolled-up InGaAs/GaAs quantum dot microtubes integrated with silicon-on-insulator waveguides," *Optics Express*, 19, 13 (2011) pp. 12164-12171.

Timoshenko, S., "Analysis of Bi-Metal Thermostats," *Journal of the Optical Society of America*, 11 (1925) pp. 233-255.

Tokuda, N. et al., "Formation of Graphene-on-Diamond Structure by Graphitization of Atomically Flat Diamond (111) Surface," *Japanese Journal of Applied Physics*, 52, 11R (2013) p. 110121.

Walmsley, Byron A. et al., "Poisson's Ratio of Low-Temperature PECVD Silicon Nitride Thin Films," *Journal of Microelectromechanical Systems*, 16, 3 (2007) pp. 622-627.

Wang, To-Po et al., "High-Q Micromachined Inductors for 10-to-30-GHz RFIC Applications on Low Resistivity Si-Substrate," *Proceedings of the 36th European Microwave Conference* (2006) pp. 56-59.

Wheeler, Harold A., "Formulas for the Skin Effect," *Proceedings of the I.R.E.*, 30, 9 (1942) pp. 412-424.

Wiemer, L. et al., "Determination of Coupling Capacitance of Underpasses, Air Bridges and Crossings in MICs and MMICs," *Electronics Letters*, 23, 7 (1987) pp. 344-346.

Xu, Xiangdong et al., "Chemical Control of Physical Properties in Silicon Nitride Films," *Appl. Phys. A*, 111 (2013) pp. 867-876.

Yu, J. et al., "Graphene-on-Diamond Devices with Increased Current-Carrying Capacity: Carbon $sp^2$-on-$sp^3$ Technology," *Nano Letters*, 12, 3 (2012) pp. 1603-1608.

Yu, Minrui et al., "Semiconductor Nanomembrane Tubes: Three-Dimensional Confinement for Controlled Neurite Outgrowth," *ACS Nano*, 5, 4 (2011) pp. 2447-2457.

Yu, X. et al., "Ultra-Small, High-Frequency, and Substrate-Immune Microtube Inductors Transformed from 2D to 3D," *Scientific Reports*, 5, 9661 (2015).

Yue, C. Patrick et al., "A Physical Model for Planar Spiral Inductors on Silicon," *Electron Devices Meeting, IEEE, IEDM*, 96 (1996) pp. 155-158.

Yue, C. Patrick et al., "Physical Modeling of Spiral Inductors on Silicon," *IEEE Transactions on Electron Devices*, 47, 3 (2000) pp. 560-568.

Zang, Ji et al., "Mechanism for Nanotube Formation from Self-Bending Nanofilms Driven by Atomic-Scale Surface-Stress Imbalance," *Physical Review Letters*, 98 (2007) pp. 146102-1-146102-4.

Zolfaghari, Alireza et al., "Stacked Inductors and Transformers in CMOS Technology," *IEEE Journal of Solid-State Circuits*, 36, 4 (2001) pp. 620-628.

\* cited by examiner

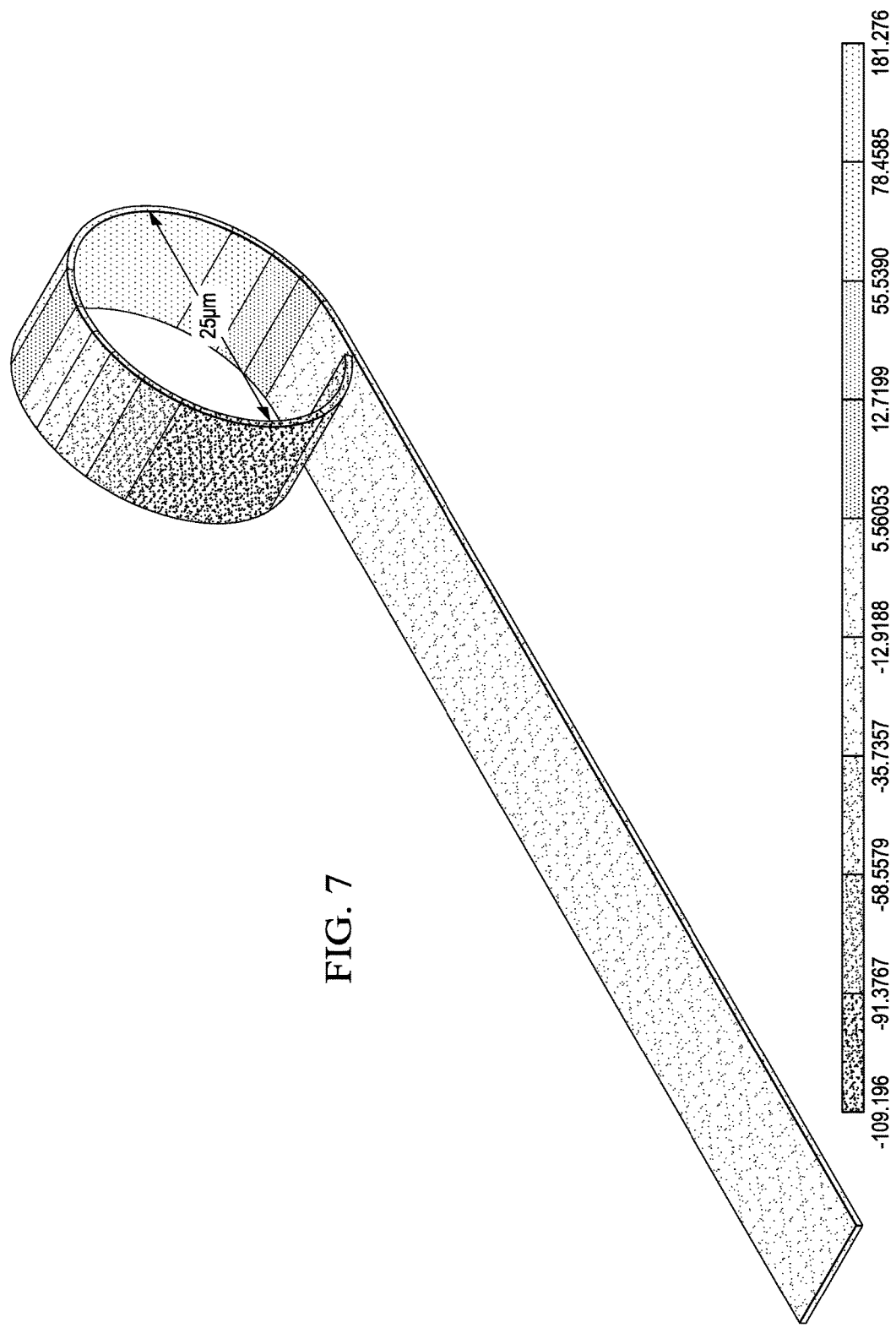

US 10,490,328 B2

ROLLED-UP POWER INDUCTOR AND ARRAY OF ROLLED-UP POWER INDUCTORS FOR ON-CHIP APPLICATIONS

RELATED APPLICATIONS

The present patent document claims the benefit of priority under 35 U.S.C. § 119(e) to U.S. Provisional Patent Application Ser. No. 62/394,775, filed on Sep. 15, 2016, which is hereby incorporated by reference in its entirety.

FEDERALLY SPONSORED RESEARCH OR DEVELOPMENT

This invention was made with government support under grant numbers 1309375 and 1449548 awarded by the National Science Foundation. The government has certain rights in the invention.

TECHNICAL FIELD

The present disclosure is directed generally to on-chip power inductors, and more particularly to power inductors fabricated using self-rolled-up membrane (S-RuM) technology.

BACKGROUND

In modern day electronics, there is an ever-increasing demand to reduce size, power, and cost of all devices and components, including voltage converters. Although significant integration of active components in converters has been made, the bottleneck to continue shrinking down device size lies in the difficulty of minimizing power inductors, especially for on-chip applications. As an energy storage device, a power inductor can require an inductance of hundreds of µH and a current carrying capacity of tens of amps. Making inductors with small footprints but large power handling ability often mandates conflicting requirements in design and processing. Achieving efficient heat dissipation in compact structures, the almost ubiquitous reason for device failure, is also difficult. The development of new strategies to achieve high inductance while minimizing the on-chip footprint of power inductors would be beneficial.

BRIEF SUMMARY

An array of rolled-up power inductors for on-chip applications comprises at least two rolled-up power inductors connected in series and formed from a stack of multilayer sheets. The at least two rolled-up inductors include a first rolled-up power inductor comprising a first multilayer sheet in a rolled configuration about a first longitudinal axis and second rolled-up power inductor comprising a second multilayer sheet in a rolled configuration about a second longitudinal axis. The first rolled-up power inductor is laterally spaced apart from the second rolled-up power inductor. The first multilayer sheet comprises a first patterned conductive layer on a first strain-relieved layer, and the second multilayer sheet comprises a second patterned conductive layer on a second strain-relieved layer. Prior to roll-up of the second and first multilayer sheets, the second multilayer sheet is disposed on the first multilayer sheet, and a through-thickness first via connects the second patterned conductive layer with the first patterned conductive layer, thereby enabling, after the roll-up, a series connection of the first and second rolled-up power inductors.

A rolled-up power inductor for on-chip applications comprises a multilayer sheet in a rolled configuration comprising multiple turns about a longitudinal axis, where the multilayer sheet comprises a patterned graphene layer on a strain-relieved layer with a thermal conduction layer in between. The patterned graphene layer comprises at least one graphene strip having a length extending in a rolling direction so as to wrap around the longitudinal axis in the rolled configuration, thereby forming an inductor cell of the rolled-up power inductor.

A method of making an array of rolled-up power inductors comprises forming a first sacrificial layer on a substrate, a first strained layer on the first sacrificial layer, and a first patterned conductive layer on the first strained layer. A second sacrificial layer is then formed on the first patterned conductive layer, and a second strained layer is formed on the second sacrificial layer. A first via is formed through the second strained layer and the second sacrificial layer to contact the first patterned conductive layer, and a second patterned conductive layer is formed on the second strained layer in contact with the first via. An end of the second sacrificial layer is etched to release the second strained layer from the substrate. Consequently, the second strained layer and the second patterned conductive layer thereon roll up to relieve strain in the second strained layer, and a second rolled-up inductor is formed. An end of the first sacrificial layer is etched to release the first strained layer from the substrate. Consequently, the first strained layer and the first patterned conductive layer thereon roll up to relieve strain in the first strained layer, thereby forming a first rolled-up inductor connected in series with and laterally spaced apart from the second rolled-up inductor.

BRIEF DESCRIPTION OF THE DRAWINGS

FIGS. 1A-1B show an exemplary strained layer comprising a top sublayer in tension and a bottom sublayer in compression deposited on a sacrificial layer on a substrate, and FIGS. 1C-1D show schematically the release and subsequent roll-up of the strained layer from the underlying sacrificial layer to form a rolled-up device.

FIG. 7 shows the results of a finite element method (FEM) simulation of a rolled-up structure comprising an ultrananocrystalline diamond (UNCD) thermal conduction layer on a silicon nitride ($SiN_x$) strained layer.

DETAILED DESCRIPTION

Described herein are rolled-up power inductors that may be fabricated singly or in close-packed arrays by self-rolledup membrane (S-RuM) technology. The power inductors may be formed in arrays in a sequential roll-up process from a stack of multilayer sheets, thereby enabling a small on-chip footprint combined with a large power handling capability. The rolled-up power inductors may include high-conductivity graphene layers on a strain-relieved membrane with an optional thermal conduction layer in between for heat dissipation. Due to the thin layered structure of graphene, which is formed from an atomic layer of $sp^2$-bonded carbon atoms, a rolled-up inductor having a small inner diameter and large number of turns may be realized.

Figure 1C:
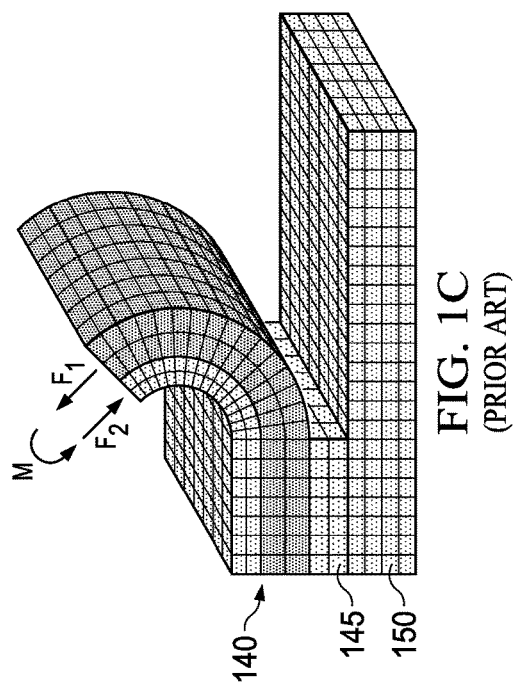
FIGS. 1A-1D provide an introduction to S-RuM technology.
Figure 1D:
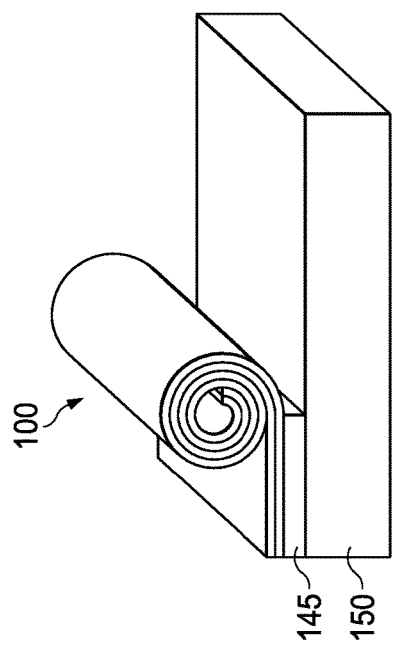
Figure 1A:
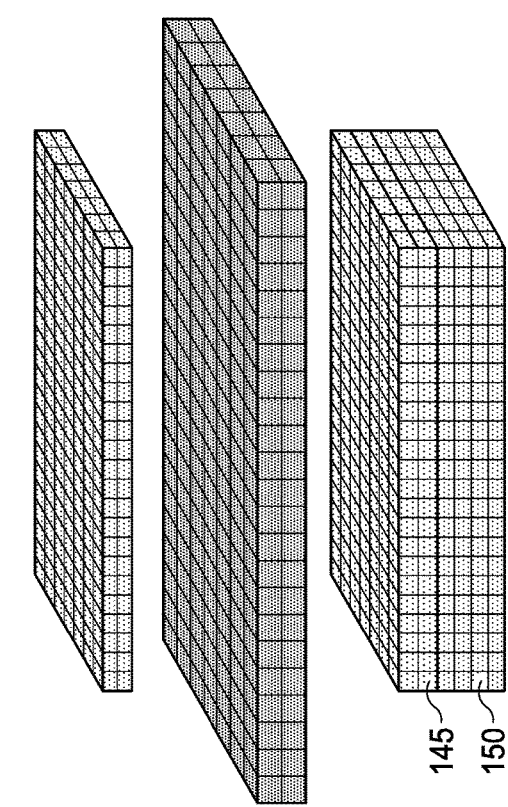
Figure 1B:
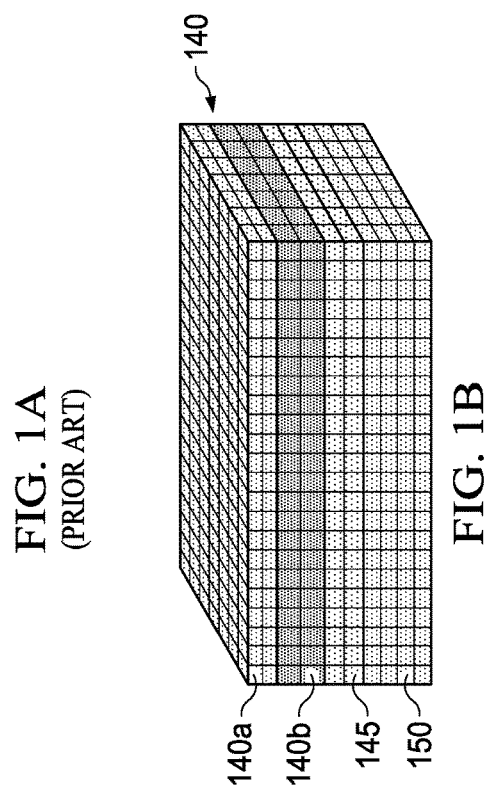

FIGS. 1A-1D provide an introduction to the self-rolling concept. Rolled-up micro- and nanodevice structures may form spontaneously when planar multilayer sheets including strained layers deform as a consequence of energy relaxation. Referring to FIGS. 1A and 1B, a planar multilayer sheet may include one or more additional layers (not visible in this figure) on an oppositely strained bilayer 140 (e.g., a top sublayer 140a in tension on a bottom sublayer 140b in compression), which is in contact with a sacrificial interlayer 145 on a substrate 150 and which may be referred to as a strained layer 140. The strained layer 140 may be released from the substrate 150 as the sacrificial layer 145 is etched away, as illustrated in FIG. 1C. Once released, the opposing strain within the layer 140 generates a net momentum, driving the planar sheet to scroll up and continue to roll into a tubular structure 100, as shown in FIG. 1D. During roll-up, residual stress in the strained layer 140 is fully or partially relieved. Accordingly, a rolled portion of the strained layer 140 may be referred to as a strain-relieved layer 140. Typically, the strained layer (and the strain-relieved layer) is formed from $SiN_x$ (0.5×1.5). Any additional layers, which are shown in other figures, can also provide additional residual stress (e.g., tensile stress) to facilitate rolling.

Figure 2:
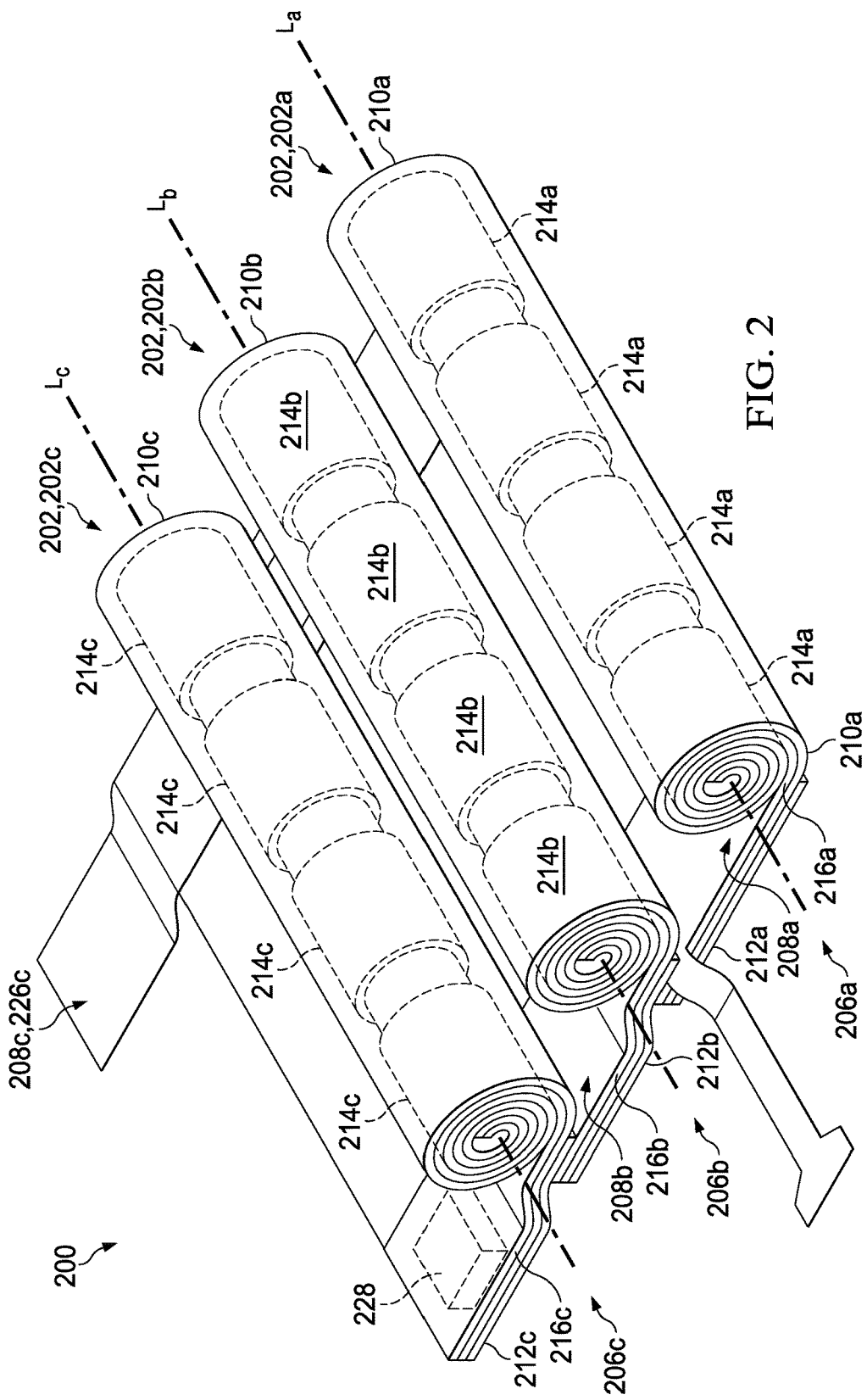
FIG. 2 shows an exemplary array of three rolled-up power inductors connected in series and formed from a stack of multilayer sheets.

Referring now to FIG. 2, an exemplary array 200 of rolled-up power inductors 202 for on-chip applications is shown. The array 200 of this example includes three rolled-up power inductors 202a, 202b, 202c connected in series and formed from a stack of multilayer sheets 206a, 206b, 206c, as will be described below in reference to FIGS. 6A-6M.

As shown in FIG. 2, the first rolled-up power inductor 202a comprises a first multilayer sheet 206a in a rolled configuration about a first longitudinal axis $L_a$. The first multilayer sheet 206a includes a first patterned conductive layer 208a on a first strain-relieved layer 210a. The first patterned conductive layer 208a includes at least one electrically conductive strip having a length extending in a rolling direction so as to wrap around the first longitudinal axis $L_a$ in the rolled configuration, thereby forming an inductor cell 214a of the first rolled-up power inductor 202a. In this example, the rolled-up power inductor 202a includes four inductor cells 214a. A first thermal conduction layer 216a may be positioned between the first patterned conductive layer 208a and the first strain-relieved layer 210a to dissipate heat from the high current passing through the inductor cells 214a.

Similarly, the second rolled-up power inductor 202b comprises a second multilayer sheet 206b in a rolled configuration about a second longitudinal axis Lb. The second multilayer sheet 206b comprises a second patterned conductive layer 208b on a second strain-relieved layer 210b. The second patterned conductive layer 208b includes at least one electrically conductive strip having a length extending in a rolling direction so as to wrap around the second longitudinal axis $L_b$ in the rolled configuration, thus forming an inductor cell 214b of the second rolled-up power inductor 202b. In this example, the rolled-up power inductor 202b includes four inductor cells 214b. A second thermal conduction layer 216b may be positioned between the second patterned conductive layer 208b and the second strain-relieved layer 210b to dissipate heat from the high current passing through the inductor cells 214b. The second rolled-up power inductor 202b is adjacent to and laterally spaced apart from the first rolled-up power inductor 202a.

Generally speaking, the array includes at least two rolled-up power inductors, and the array 200 of this example includes a third rolled-up power inductor 202c comprising a third multilayer sheet 206c in a rolled configuration about a third longitudinal axis L. The third multilayer sheet 206c comprises a third patterned conductive layer 208c on a third strain-relieved layer 210c with, optionally, a third thermal conduction layer 216c in between. The third patterned conductive layer 208c includes at least one electrically conductive strip having a length extending in a rolling direction so as to wrap around the third longitudinal axis $L_e$ in the rolled configuration, thus forming an inductor cell 214c of the third rolled-up power inductor 202c. In this example, the rolled-up power inductor 202c includes four inductor cells 214c. The third rolled-up power inductor 202c is adjacent to and laterally spaced apart from the second rolled-up power inductor 202b.

Prior to roll-up of any of the power inductors, the third multilayer sheet 206c is positioned or stacked on the second multilayer sheet 206b, and the second multilayer sheet 206b is positioned or stacked on the first multilayer sheet 206a. A through-thickness first via 218 (visible in FIG. 6F) connects the first patterned conductive layer 208a with the second patterned conductive layer 208b and a through-thickness second via 228 connects the third patterned conductive layer 208c with the second patterned conductive layer 208b, thereby enabling, after the roll-up, a series connection of the rolled-up power inductors 202a, 202b, 202c.

The rolled configuration of each multilayer sheet 206a, 206b, 206c includes multiple turns about the respective longitudinal axis $L_a$, $L_b$, $L_c$, with from 5 turns to 500 turns being typical. An increase in the total inductance of the array may be achieved by increasing the number of rolled-up power inductors connected in series in the array, and/or by increasing the number of turns of each rolled-up power inductor. At a minimum, the array may comprise a total inductance of at least about 1 µH. Typically the total inductance is at least about 1 mH or at least about 1 H, and may be about 1.3 H or higher. A lateral spacing of adjacent rolled-up power inductors in the array may be as small as desired and is typically no greater than about 250 microns; a closer lateral spacing ensures a smaller on-chip footprint. As a consequence of the fabrication process, which is described in detail below, the rolled-up power inductors of a given array fabricated from a stack of multilayer sheets may be disposed substantially parallel to each other on the substrate, an orientation that allows for a close spacing.

Generally speaking, the array may comprise n rolled-up power inductors connected in series and formed from a stack of n multilayer sheets, where $2 \leq n \leq 100$ and more typically $4 \leq n \leq 20$. For example, $i^{th}$, $k^{th}$, and $j^{th}$ rolled-up power inductors ($1 \leq i < j < k \leq n$) from the array may comprise, respectively: an $i^{th}$ multilayer sheet in a rolled configuration about an $i^{th}$ longitudinal axis, the $i^{th}$ multilayer sheet comprising an $i^{th}$ patterned conductive layer on an $i^{th}$ strain-relieved layer with an optional $i^{th}$ thermal conduction layer therebetween; a $k^{th}$ multilayer sheet in a rolled configuration about a $k^{th}$ longitudinal axis, the $k^{th}$ multilayer sheet comprising a $k^{th}$ patterned conductive layer on a $k^{th}$ strain-relieved layer with an optional $k^{th}$ thermal conduction layer therebetween; and a $j^{th}$ multilayer sheet in a rolled configuration about a $j^{th}$ longitudinal axis, the $j^{th}$ multilayer sheet comprising a $j^{th}$ patterned conductive layer on a $j^{th}$ strain-relieved layer with an optional $j^{th}$ thermal conduction layer therebetween. The $i^{th}$, $j^{th}$ and $k^{th}$ patterned conductive layers may each comprise at least one conductive strip having a length extending in a rolling direction so as to wrap around the respective longitudinal axis in the rolled configuration, thereby forming an inductor cell of the $i^{th}$, $j^{th}$, or $k^{th}$ rolled-up power inductor.

Prior to roll-up of the $i^{th}$ multilayer sheet about the $i^{th}$ longitudinal axis, the $k^{th}$ multilayer sheet about the $k^{th}$ longitudinal axis, and the $j^{th}$ multilayer sheet about the $i^{th}$ longitudinal axis, the $k^{th}$ multilayer sheet is disposed on the $j^{th}$ multilayer sheet, and the $j^{th}$ multilayer sheet is disposed on the $i^{th}$ multilayer sheet. Thus, prior to roll-up, the $i^{th}$, $j^{th}$ and $k^{th}$ multilayer sheets form a stack. A through-thickness $i^{th}$ via connects the $i^{th}$ patterned conductive layer to the $j^{th}$ patterned conductive layer, and a through-thickness $j^{th}$ via connects the $j^{th}$ patterned conductive layer with the $k^{th}$ patterned conductive layer, thereby enabling, after roll-up, a series connection of the $i^{th}$, $k^{th}$, and $j^{th}$ rolled-up power inductors.

Figure 3:
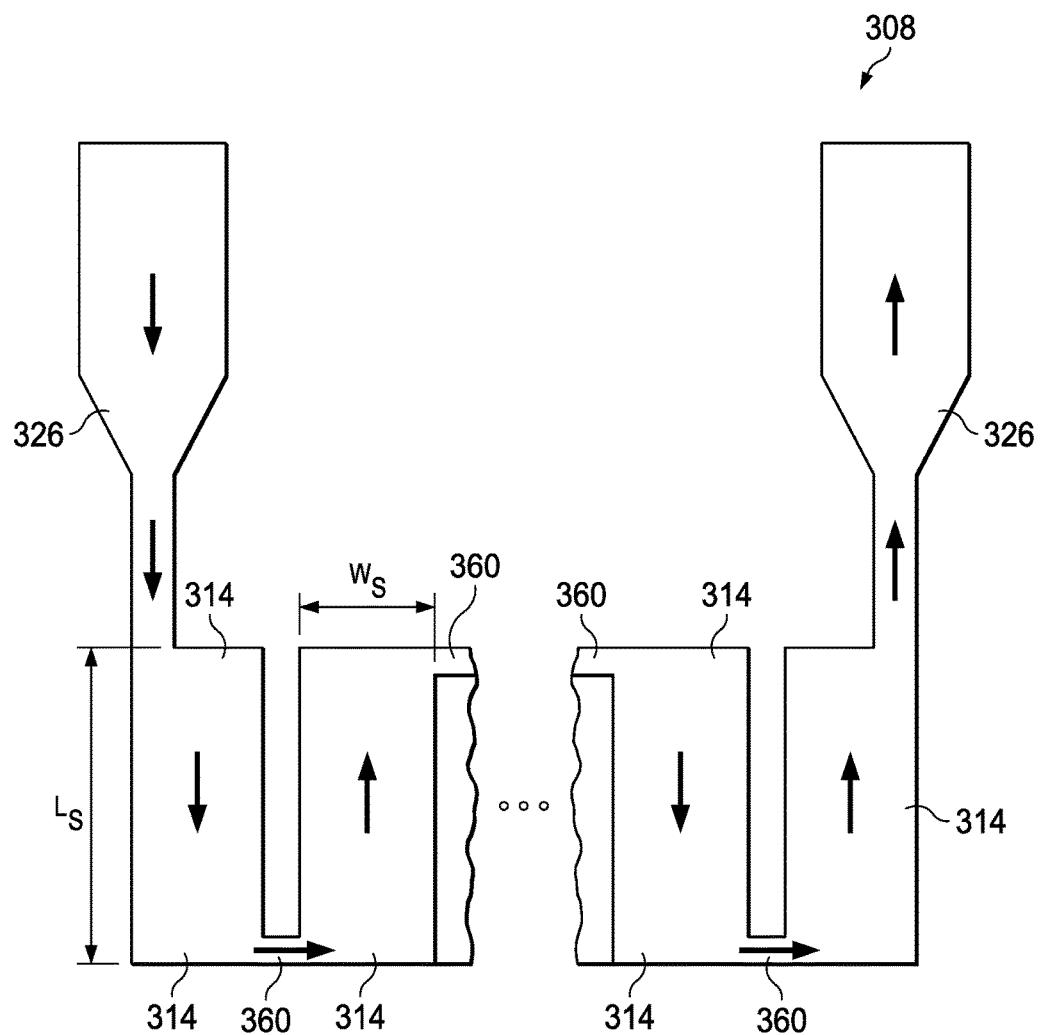
FIG. 3 shows a top view of an exemplary patterned conductive layer for a rolled-up power inductor as deposited and patterned on a surface (e.g., on a strained layer or thermal conduction layer) prior to rolling up.

FIG. 3 shows a top view of an exemplary patterned conductive layer (e.g., a patterned graphene layer) deposited on a strained layer to form an inductor cell geometry upon roll-up, as set forth in U.S. Pat. No. 9,224,532 to Li et al., which issued on Dec. 29, 2015, and is hereby incorporated by reference in its entirety. The patterned conductive layer 308 may comprise a series of conductive strips or inductor cells 314 repeating along a direction of the longitudinal axis, where each inductor cell has a length extending in a circumferential (or rolling) direction. In the rolled configuration, the inductor cells wrap around the respective longitudinal axis, as shown schematically in FIG. 2. Since each of the conductive strips 314 serves as an inductor cell of the rolled-up power inductor structure, the terms "conductive strip" and "inductor cell" may be used interchangeably in this disclosure. Each inductor cell 314 has a width $w_5$ and a length $L_5$ along the rolling or circumferential direction. The inductance may be maximized when the inductor cells 314 are aligned such that the length of each cell 314 is substantially parallel to (e.g., within ±1° of) the rolling direction. If the inductor cells 314 are positioned at a non-zero angle with respect to the rolling direction, the inductance may be reduced.

Figure 4:
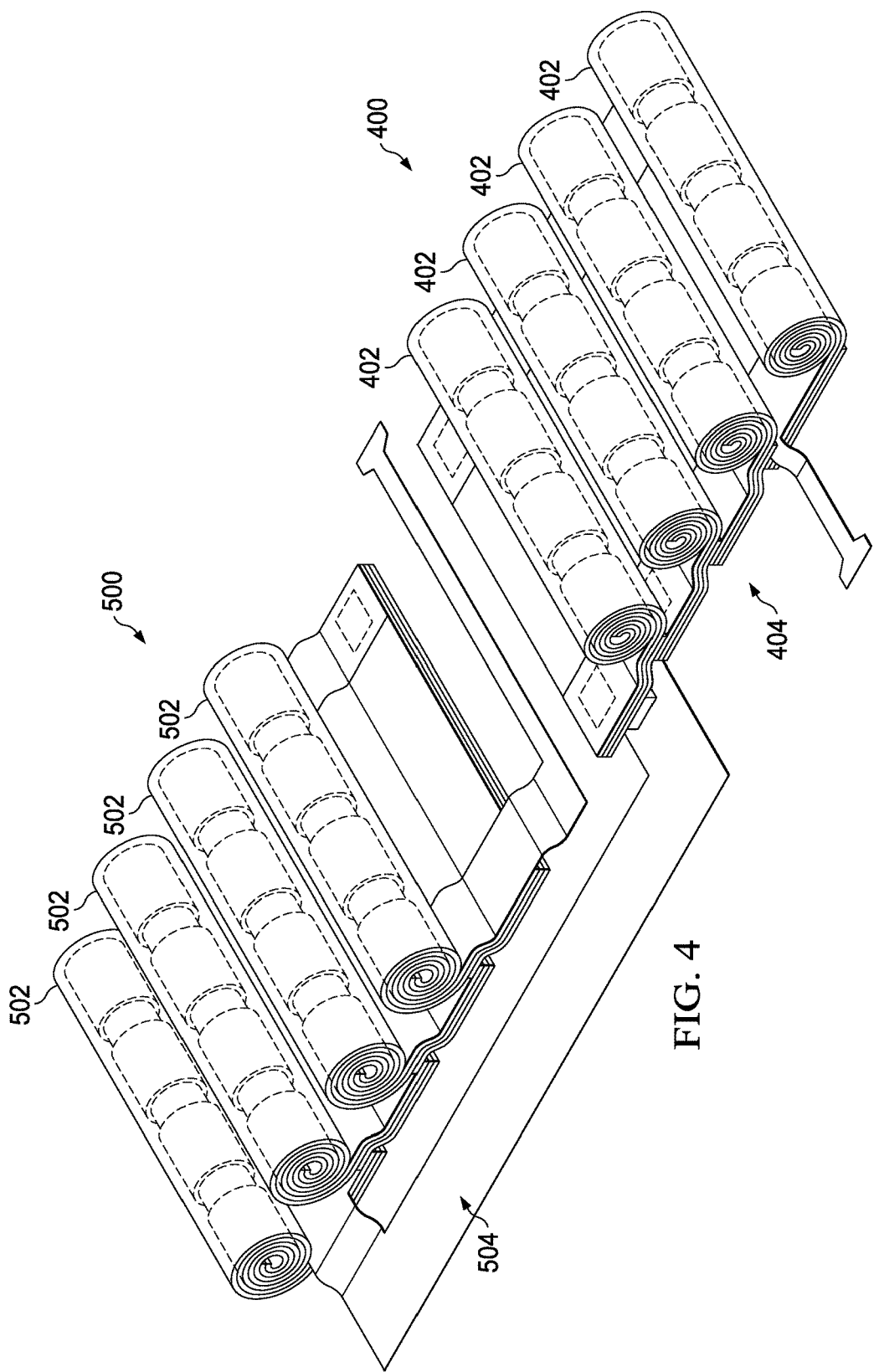
FIG. 4 shows two interconnected arrays of four rolled-up power inductors connected in series, where each array is formed from a stack of multilayer sheets.

The patterned conductive layer 308 may also include two conductive feed lines or contact portions 326 connected to the conductive strip 314 to provide a pathway for passage of electrical current therethrough. The patterned conductive layer 308 may also include connecting lines 360 that connect adjacent inductor cells 314 in series. The conductive feed lines or contact portions 326 may not be part of the rolled configuration; that is, the contact portions 326 do not necessarily wrap around the longitudinal axis. It is also possible that one or more contact portions 326 may not be present if a signal may be fed to the rolled-up power inductor by other passive or active components on the chip. The contact portions 326 may be employed for external electrical connections, to connect adjacent rolled-up power inductors in series (e.g., in conjunction with vias), and/or to connect adjacent rolled-up power inductor arrays. As shown in FIG. 4, adjacent stacks 404, 504 of multilayer sheets can be used to form adjacent and interconnected arrays 400, 500 of rolled-up power inductors 402, 502, allowing a high inductance to be achieved.

Referring again to FIG. 2, the strain-relieved layer 210a, 210b, 210c that underlies the patterned conductive layer 208a, 208b, 208c may comprise one or more sublayers that are at least partially relieved of lattice strain as a consequence of rolling. The multilayer sheet comprising the strain-relieved layer includes less strain (or no strain) in the rolled configuration than in an unrolled or planar configuration. Accordingly, the one or more sublayers that are referred to as a strain-relieved layer in the rolled configuration may be referred to as a strained layer in the unrolled configuration. In the schematics of FIGS. 1A-1D, the strain-relieved layer (and the strained layer) comprises two sublayers, which may be referred to as a bilayer. Specifically, the strained layer or bilayer 140 may comprise a top sublayer 140a in tension and a bottom sublayer 140b in compression to facilitate the rolling up shown schematically in FIGS. 1C-1D. The bilayer 140 may thus be referred to as an oppositely strained bilayer. The strain-relieved layer and the strained layer may comprise a single crystalline, polycrystalline or amorphous material.

The strain-relieved and strained layer may comprise an electrically insulating material such as silicon nitride, silicon oxide, or boron nitride. In one example, the layer may comprise non-stoichiometric silicon nitride ($SiN_x$, where x may have a value from about 0.5 to about 1.5), which may be amorphous, or stoichiometric silicon nitride (e.g., $Si_3N_4$, $Si_2N$, SiN or $Si_2N_3$). The layer may also or alternatively include another material, such as an elemental or compound semiconducting material or a polymer. For example, single crystal films such as InAs/GaAs, InGaAs/GaAs, InGaAsP/InGaAsP, Si—Ge/Si may be used as the strained layer.

The thermal conduction layer 216a, 216b, 216c that may lie between the strained layer 210a, 210b, 210c and the patterned electrically conductive layer 208a, 208b, 208c may comprise diamond (e.g., single crystalline diamond, polycrystalline diamond, ultrananocrystalline diamond), graphite (e.g., graphite monolayers or a few layers (including intercalated layers)), carbon nanotubes, boron nitride (e.g., h-BN, c-BN), silicene, a transition metal dichalcogenide (e.g., $MoS_2$ $MoSe_2$, $WSe_2$, $WS_2$), or another suitable thermally conductive material.

The patterned conductive layers 208a, 208b, 208c comprise an electrically conductive material such as a metal (e.g., silver, gold, aluminum, copper, molybdenum, tungsten, zinc, palladium, platinum and/or nickel) or carbon (e.g., graphene, graphite and/or diamond). For example, the patterned conductive layers 208a, 208b, 208c may include one or more atomic layers (monolayers) of graphene to achieve low electrical resistance without excessively increasing layer thickness, which can hinder roll-up. Thus, the patterned conductive layers 208a, 208b, 208c may be patterned graphene layers. The patterned graphene layers may include from 2 to 20 or from 3 to 5 atomic layers of graphene. The graphene may include a dopant, such as boron or nitrogen, to enhance the conductivity of the patterned graphene layer. Few-layer graphene disposed on ultrananocrystalline diamond has been shown to have a current-carrying capacity as high as about 18 $\mu A/nm^2$ even under ambient conditions, which suggests that 5-layer graphene in the form of a graphene strip of 100 microns in width may be able to handle about 9 A of current.

The through-thickness first and second vias 218, 228 may comprise one or more electrically conductive materials selected from the group consisting of silver, gold, aluminum, copper, molybdenum, tungsten, zinc, palladium, platinum, nickel and carbon (e.g., graphite, diamond, graphene).

Figure 5A:
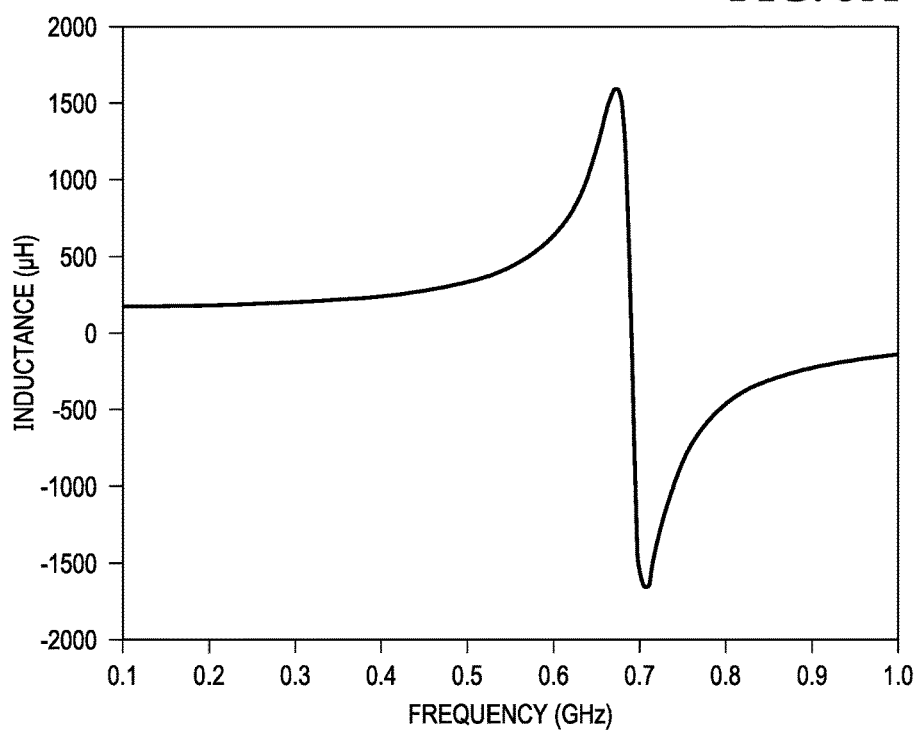
FIGS. 5A and 5B show simulated inductance and associated Q factor of a 500-turn, 100-cell rolled-up power inductor comprising multi-layer graphene as the patterned conductive layer on a thermal conduction layer comprising diamond, where a 0.1 Ω/sq sheet resistance is assumed.
Figure 5B:
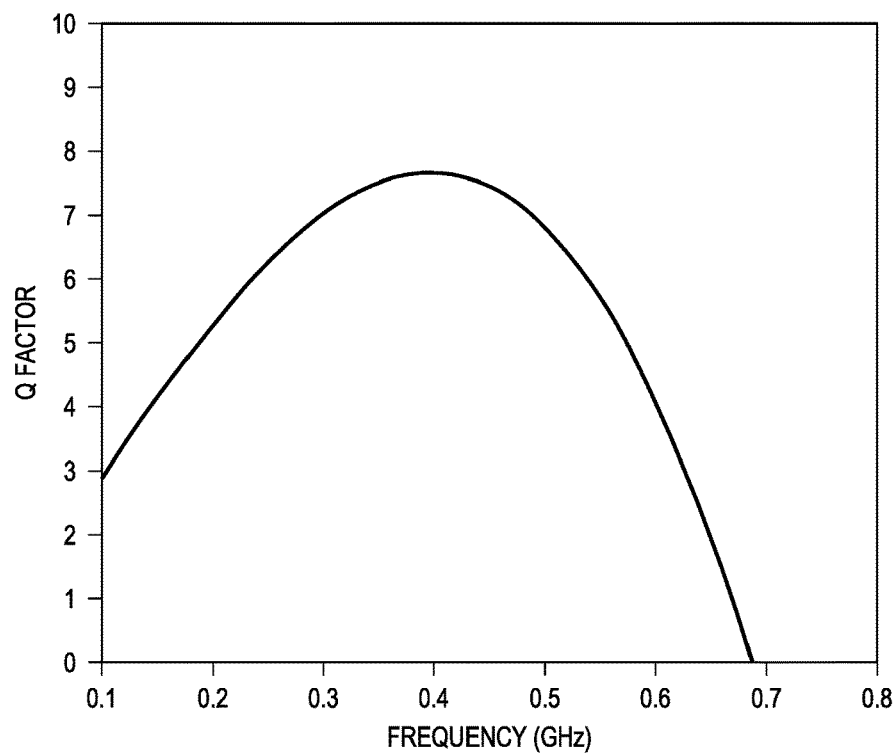

To calculate the inductance and associated Q factor of a rolled-up inductor utilizing multiple-layer graphene as the patterned conductive layer on an ultrananocrystalline diamond thermal conduction layer, the resistance of the inductor needs to be determined. Total resistance may be assumed to be the combination of contact resistance and channel resistance. Many effects, including polar optical phonon scattering from an underlying substrate, interlayer scattering, interface impurity charging, carrier concentration, etc., can cause variations of the total resistance. What may be referred to as two-dimensional (2D) van der Waals sheets, such as hexagonal boron nitride (h-BN), where no dangling bonds exist on the surface, can be used as a substrate under the graphene to enhance the electron mobility. Many-layer graphene including suitable dopant(s) may also be a strategy to increase the electron concentration. The reported smallest sheet resistance of 4-layer graphene with 90% transparency is ~10 $\Omega$/sq. Assuming that many more doped layers with minimal defect density can be used to reduce the sheet resistance to as small as 0.1 $\Omega$/sq, as assumed in FIGS. 5A and 5B, a 166 µH 500-turn-100-cell rolled-up power inductor with 200 µm wide conductive strip(s) comprising multiple-layer graphene is projected to yield a self-resonance frequency f, of 700 MHz and a maximum current of at least about 18 A at ambient temperature (for an inner diameter of about 25 µm, an outer diameter of about 66 µm, and a total length of about 25 mm, with a 50 µm separation distance between adjacent cells). In other words, the on-chip footprint may be about 1.65 mm$^2$ or less. If an array is constructed containing eight 500-turn-100-cell rolled-up inductors, a total inductance of about 1.328 H may be obtained.

A method of making an array of rolled-up power inductors is described in reference to FIGS. 6A-6M.

Figure 6A:
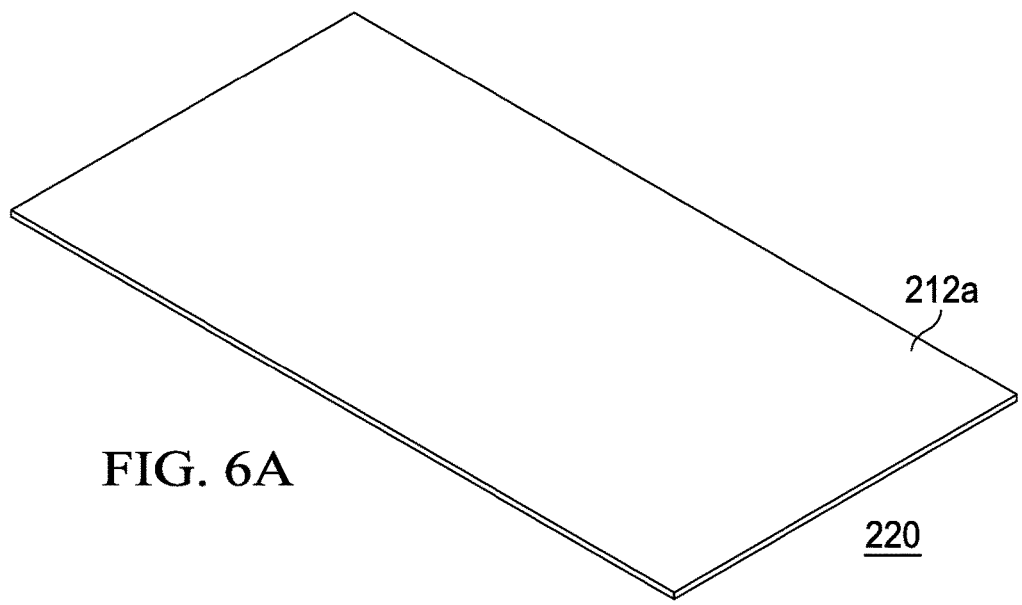
FIGS. 6A-6M show exemplary steps to fabricate the array of rolled-up power inductors shown in FIG. 2.
Figure 6B:
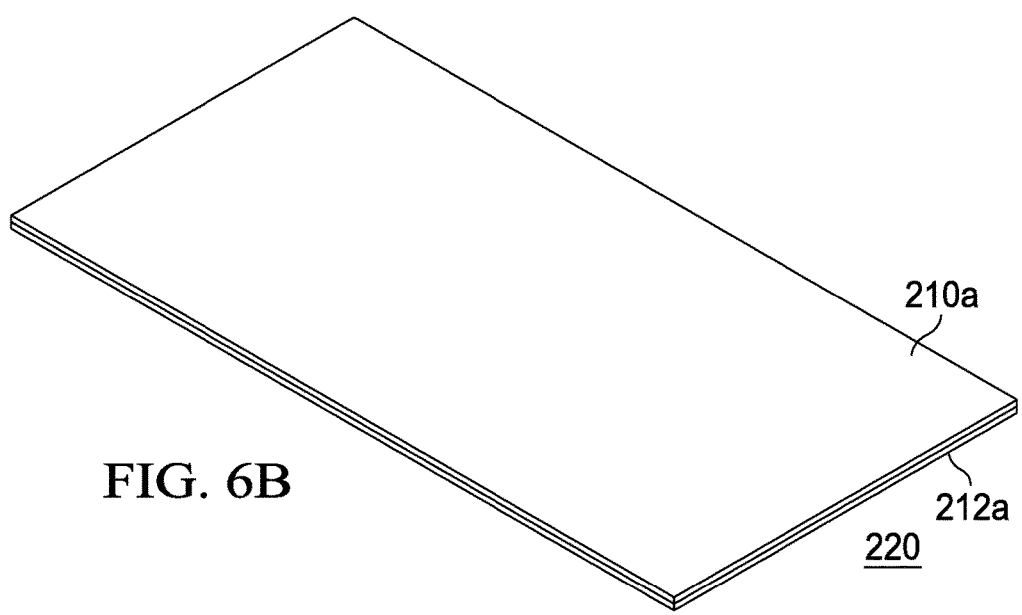

A first sacrificial layer 212a is formed on a substrate 220, as shown in FIG. 6A, and a first strained layer 210a is formed on the first sacrificial layer 212a, as shown in FIG. 6B. As explained above, the sacrificial layer 212a is ultimately etched from one end (or otherwise gradually removed) to induce roll-up of the strained layer 210a; however, this does not occur until much later in the process.

Figure 6C:
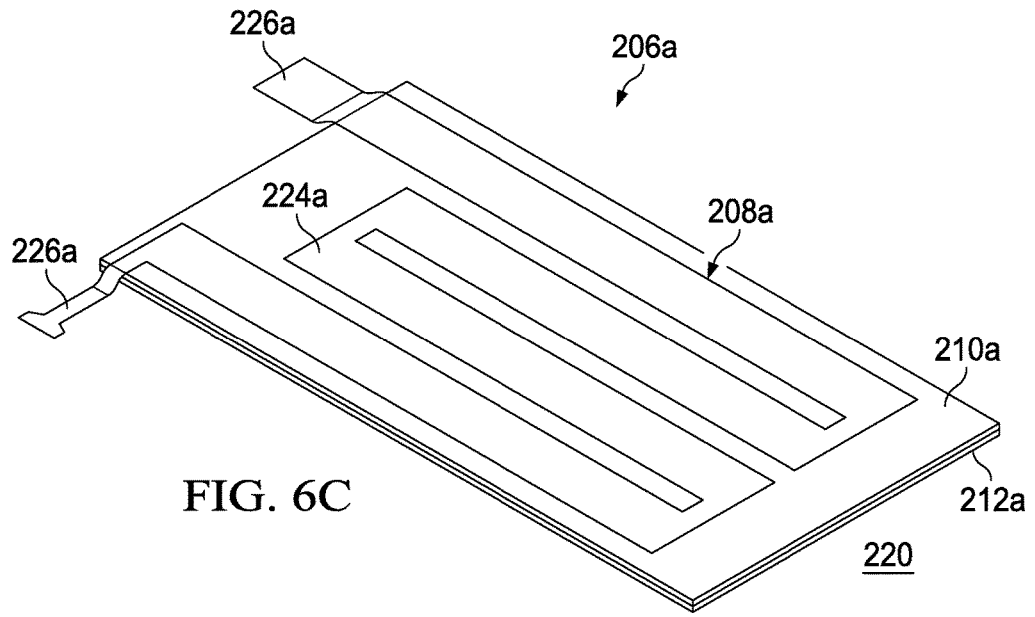

Referring to FIG. 6C, a first patterned conductive layer 208a is then formed on the first strained layer 210a. More specifically, a first inductor cell portion 224a of the first patterned conductive layer 208a may be formed on the first strained layer 210a, where roll-up occurs, and a first contact portion 226a of the first patterned conductive layer 208a may be formed directly on the substrate 220 at a location where roll-up may not occur.

As shown in FIG. 2, a first thermal conduction layer 216a may be formed between the first patterned conductive layer 208a and the first strained layer 210a to dissipate heat during use of the rolled-up inductor 202a.

Referring again to FIG. 6C, the first strained layer 210a, the optional first thermal conduction layer 216a, and the first patterned conductive layer 208a, which may comprise one or more atomic layers of graphene and thus may be referrred to as a first patterned graphene layer, form the first multilayered sheet 206a. An electrically insulating film (e.g., alumina) may also form part of the first multilayered sheet 206a, as explained below. The first multilayered sheet 206a is in an unrolled configuration after formation of each of the layers 208a, 210a, 216a and prior to etching of the first sacrificial layer 212a to induce roll-up.

Figure 6D:
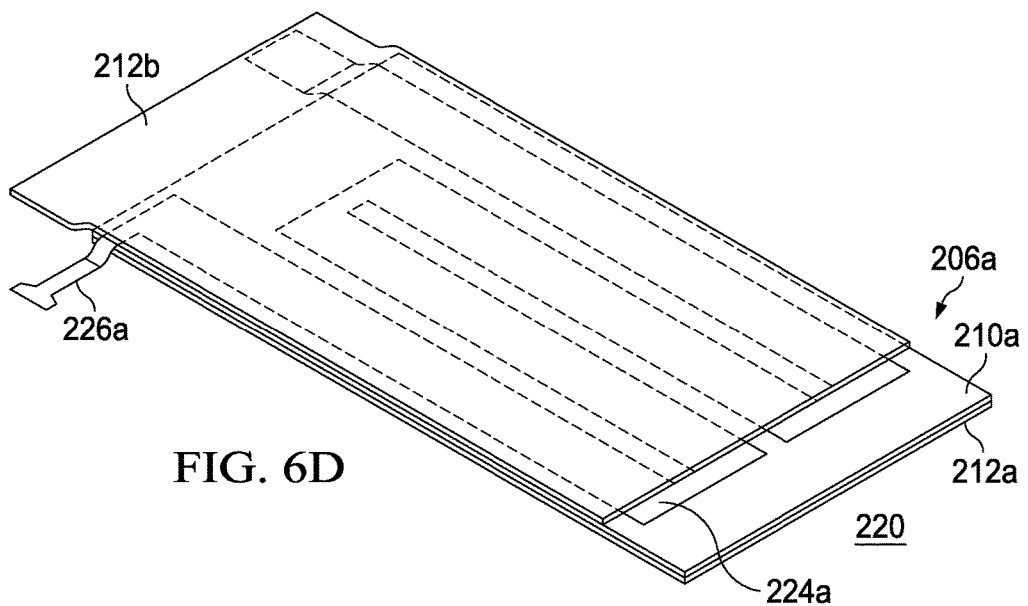
Figure 6E:
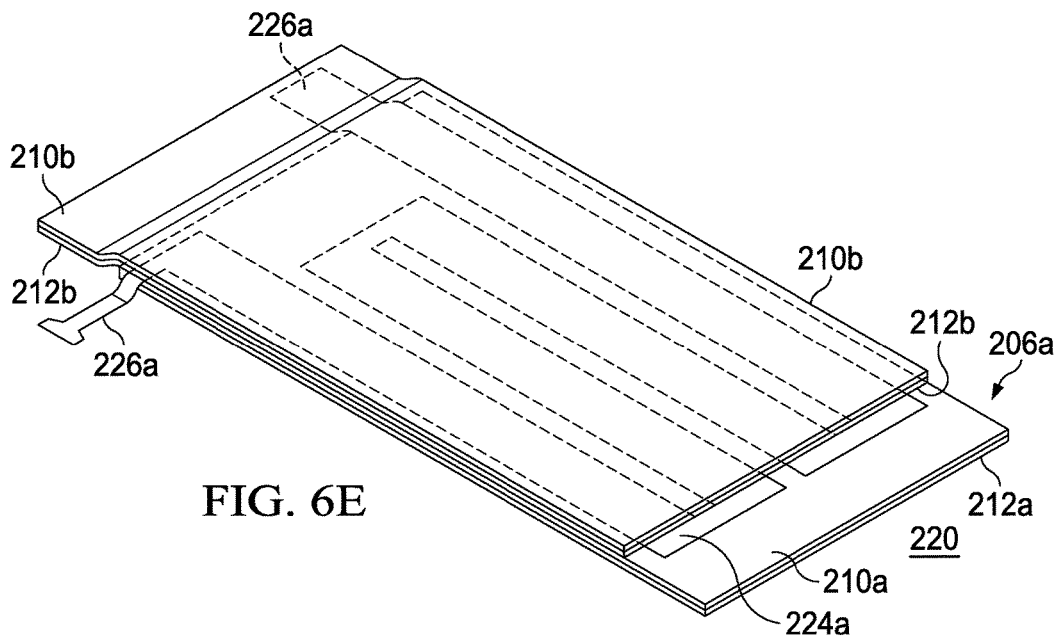

A second sacrificial layer 212b is then formed on the first patterned conductive layer 208a, as shown in FIG. 6D, and a second strained layer 210b is formed on the second sacrificial layer 212b, as shown in FIG. 6E. The electrically insulating film mentioned above may be deposited on the first patterned conductive layer 208a prior to formation of the second sacrificial layer 212b.

Figure 6F:
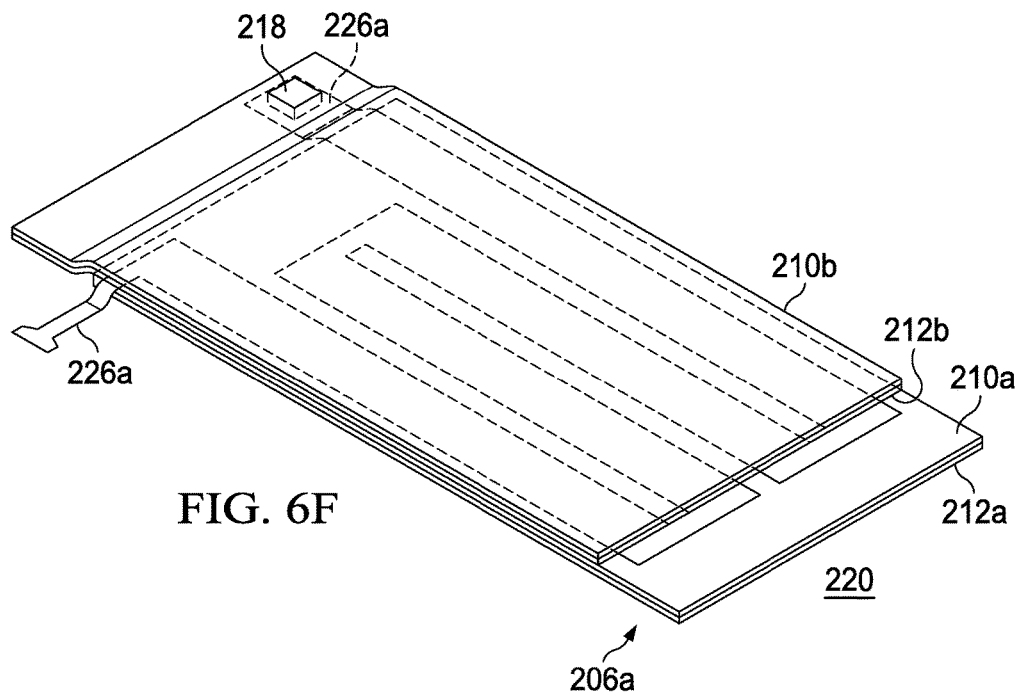

A first via 218 is formed through the second strained layer 210b, the second sacrificial layer 212b, and the insulating film, if present, so as to contact the first patterned conductive layer 208a, as shown in FIG. 6F. The first via 218 may contact the first patterned conductive layer 208a at one of the first contact portions 226a.

Figure 6G:
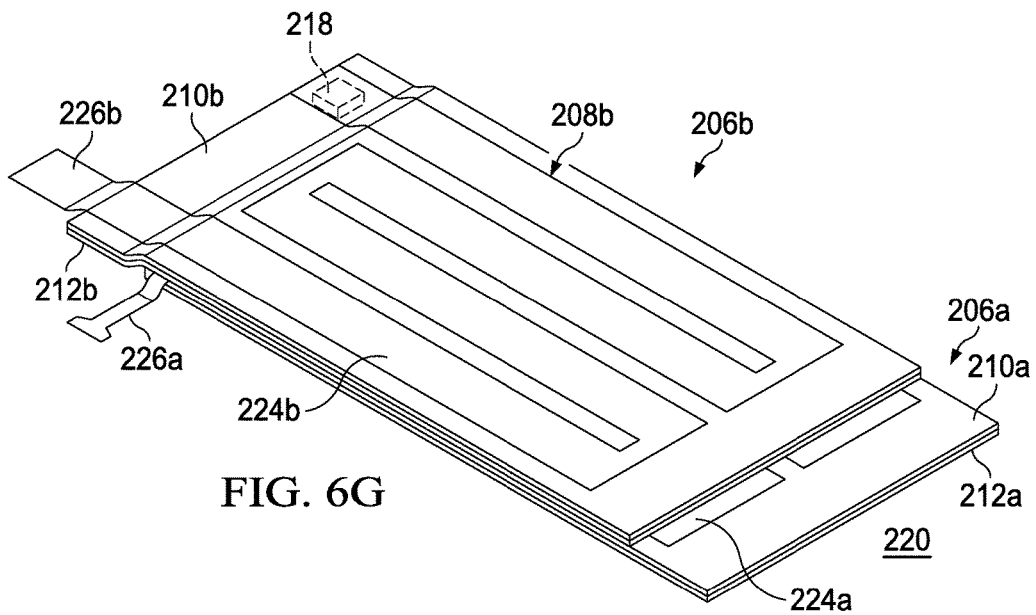

Referring now to FIG. 6G, a second patterned conductive layer 208b is formed on the first strained layer 210b in contact with the first via 218. More specifically, a second inductor cell portion 224b of the second patterned conductive layer 208b may be formed on the second strained layer 210b, where roll-up occurs, and a second contact portion 226b of the second patterned conductive layer 208b may be formed directly on the substrate 220 at a location where roll-up may not occur.

A second thermal conduction layer 216b, as shown in FIG. 2, may be formed between the second patterned conductive layer 208b and the second strained layer 210b to dissipate heat during use of the rolled-up inductor 202b.

Referring again to FIG. 6G, the second strained layer 210b, the optional second thermal conduction layer 216b, and the second patterned conductive layer 208b, which may comprise one or more atomic layers of graphene and thus may be referrred to as a second patterned graphene layer, form the second multilayered sheet 206b. An electrically insulating film (e.g., alumina) may also form part of the second multilayered sheet 206b, as explained below. The second multilayered sheet 206b is in an unrolled configuration after formation of each of the layers 210b, 216b, 208b and prior to etching of the second sacrificial layer 212b to induce roll-up.

A third multilayer sheet, or up to n multilayer sheets, each including the layers described above in an unrolled configuration, may be formed in the stack prior to roll-up of any of the rolled-up power inductors.

Figure 6H:
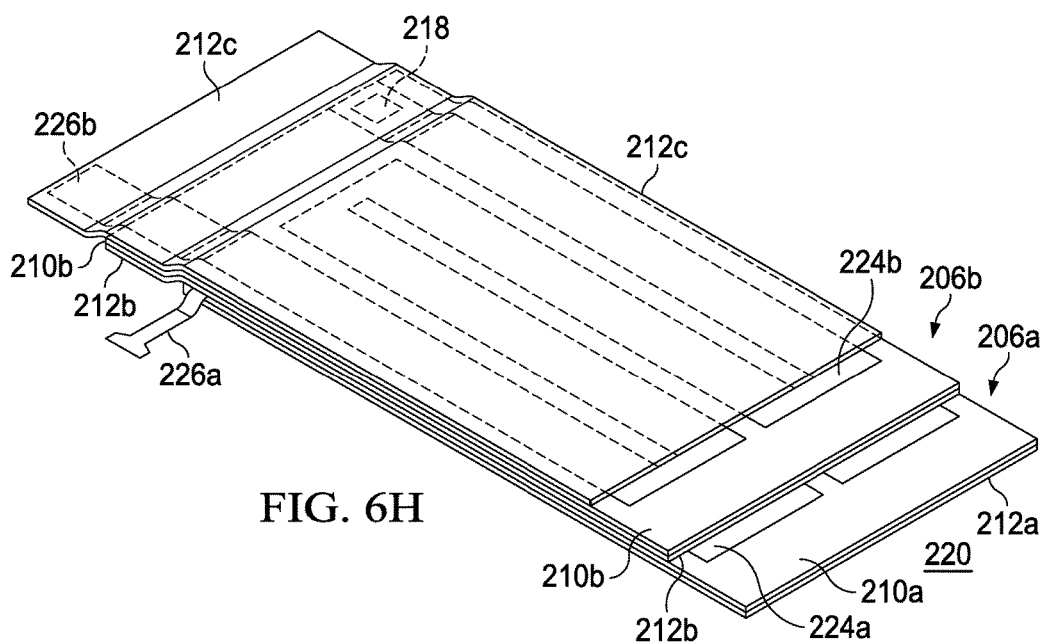

In the case of a third multilayer sheet 206c, a third sacrificial layer 212c may be formed on the second patterned conductive layer 208b, as shown in FIG. 6H, prior to the etching of the ends of the second and first sacrificial layers 212b, 212a to initiate roll-up. The electrically insulating film mentioned above may be deposited on the second patterned conductive layer 208b prior to formation of the third sacrificial layer 212c.

Figure 6I:
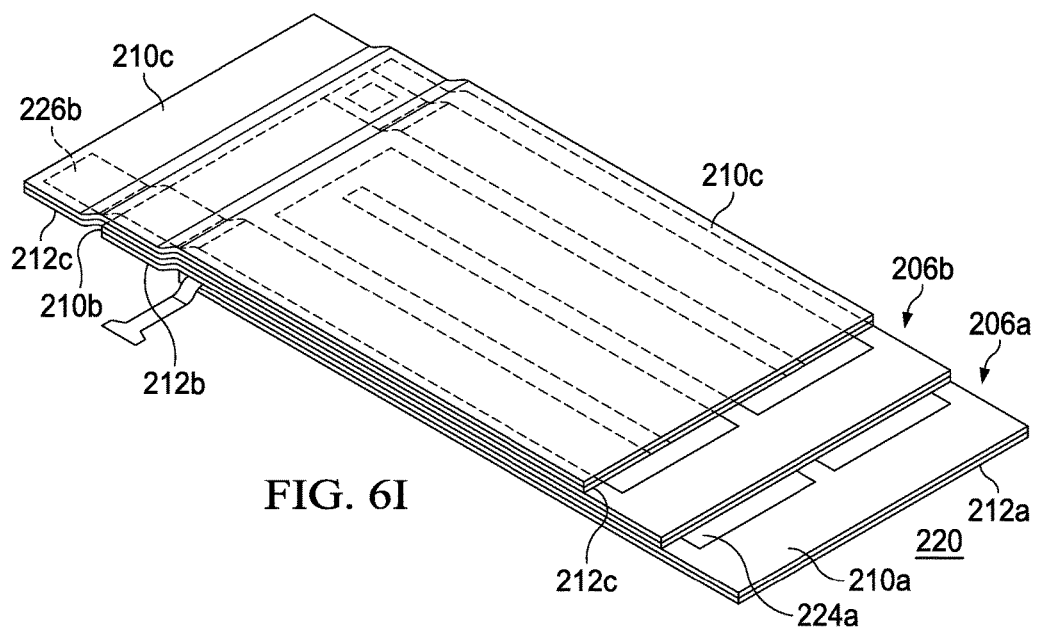
Figure 6J:
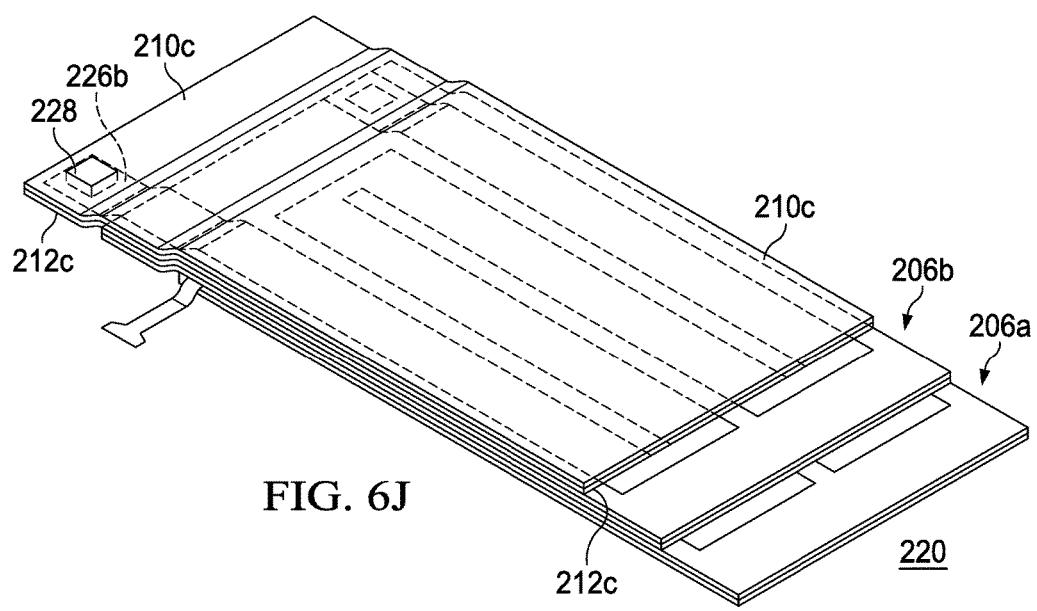

A third strained layer 210c may be formed on the third sacrificial layer 212c, as shown in FIG. 6I, and a second via 228 may be formed through the third strained layer 210c, the third sacrificial layer 212c, and the electrically insulating film, if present, to contact the second patterned conductive layer 208b, as shown in FIG. 6J. The second via 228 contacts the second patterned conductive layer 208b at the second contact portion 226b.

Figure 6K:
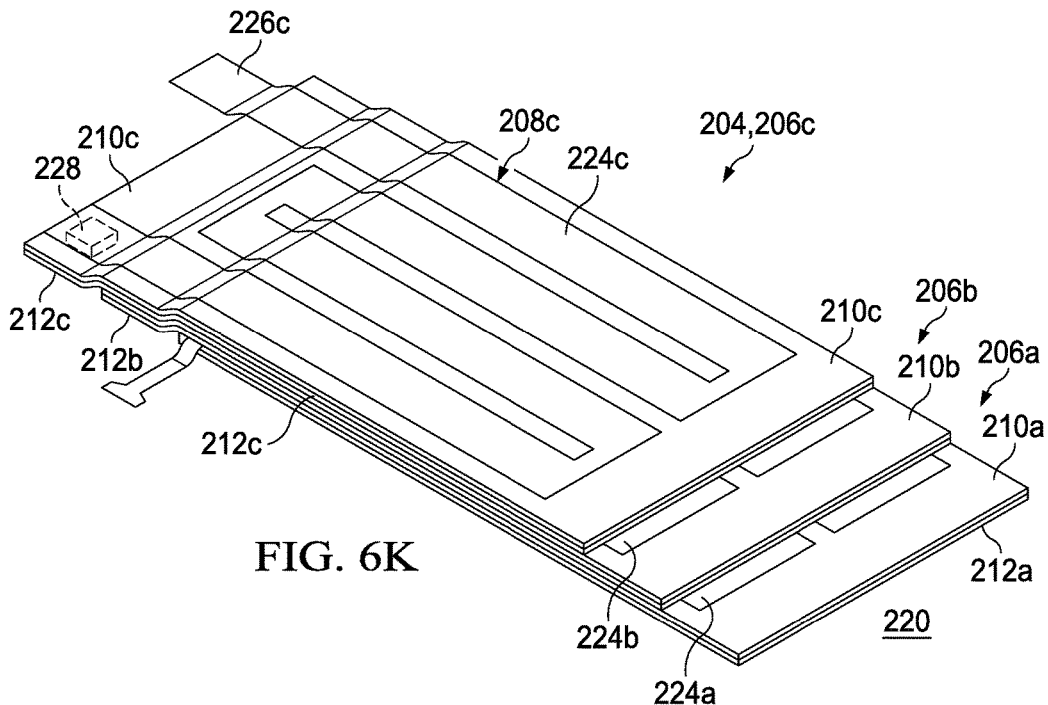

A third patterned conductive layer 208c is formed on the third strained layer 210c in contact with the second via 228, as shown in FIG. 6K. More specifically, a third inductor cell portion 224c of the third patterned conductive layer 208c may be formed on the third strained layer 210c where roll-up occurs, and a third contact portion 226c of the third patterned conductive layer 208c may be formed directly on the substrate 220 at a location where roll-up may not occur.

A third thermal conduction layer 216c may be formed between the third patterned conductive layer 208c and the third strained layer 210c, as shown in FIG. 2, to dissipate heat during use of the rolled-up inductor 202c. An electrically insulating film, such as alumina, may be deposited on the third patterned conductive layer 208c prior to forming any additional layers or initiating roll-up.

Referring again to FIG. 6K, the third strained layer 210c, the optional third thermal conduction layer 216c, and the third patterned conductive layer 208c, which may comprise one or more atomic layers of graphene and thus may be referrred to as a third patterned graphene layer, form the third multilayered sheet 206c referred to above. The electrically insulating film mentioned above may also form part of the third multilayered sheet 206c. The third multilayered sheet 206c is in an unrolled configuration after formation of each of the layers 208c, 210c, 216c and prior to etching of the third sacrificial layer 212c to induce roll-up. After formation of the stack 204 of multilayer sheets 206a, 206b, 206c, roll-up may be initiated.

Figure 6L:
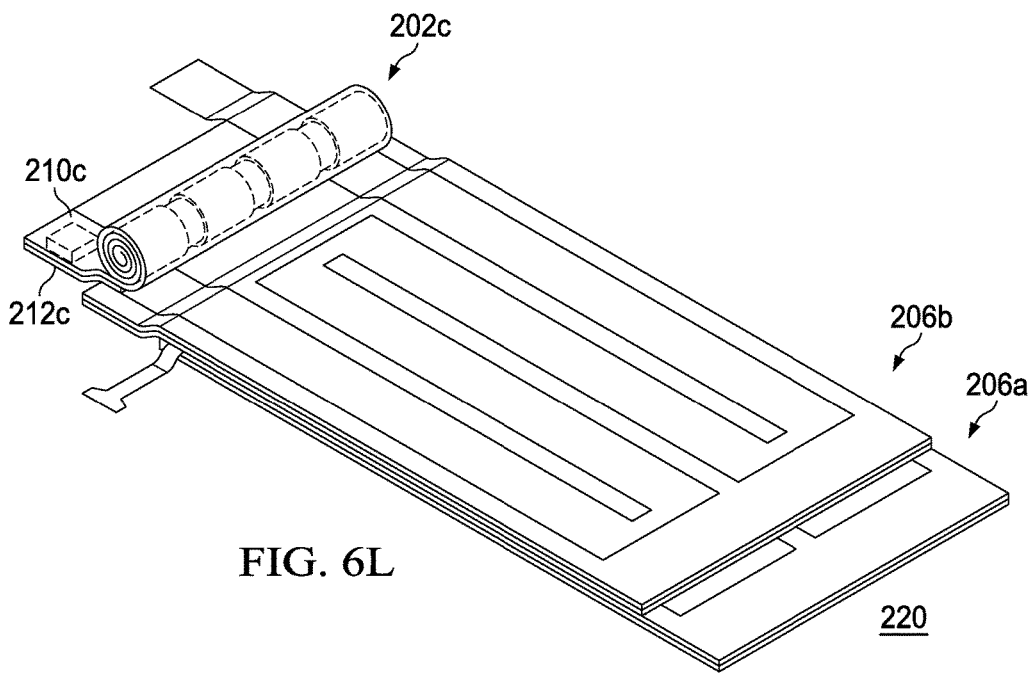

Referring to FIG. 6L, an end of the third sacrificial layer 212c is etched to release the third strained layer 210c. Consequently, the third strained layer 210c and the third inductor portion 224c of the third patterned conductive layer 208c (as well as the optional third thermal conduction layer 216c) roll up to relieve strain in the third strained layer 210c. A third rolled-up inductor 202c is thus formed, as shown in FIG. 6L and in FIG. 2.

Figure 6M:
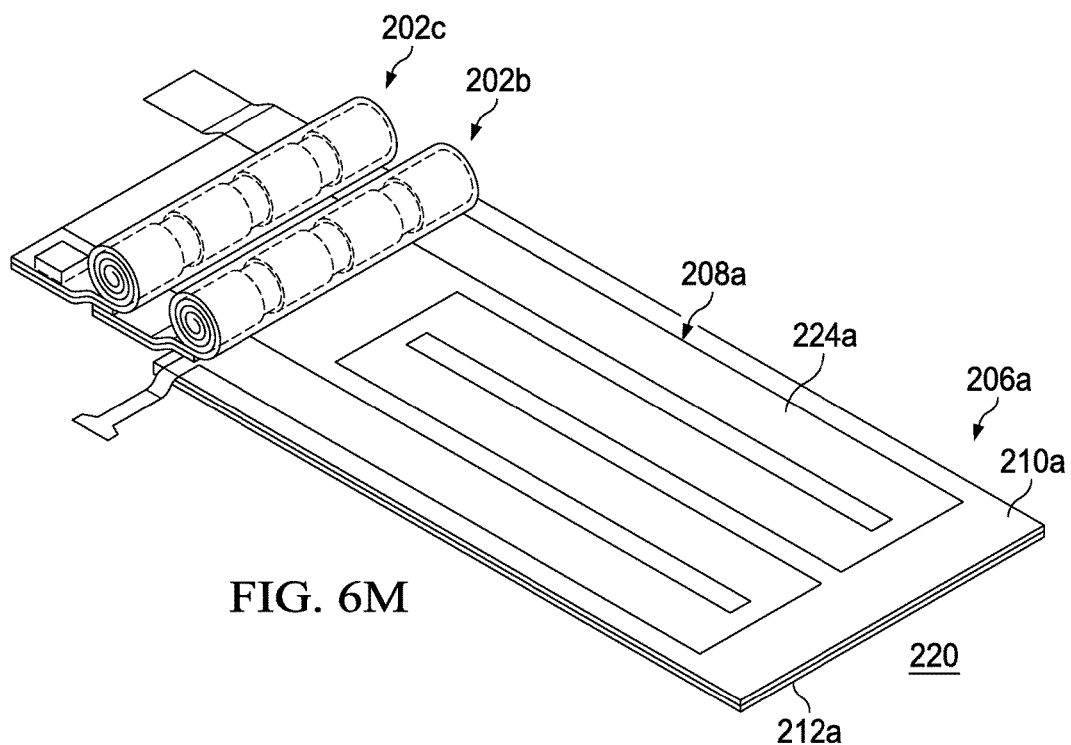

Referring to FIG. 6M, an end of the second sacrificial layer 212b is etched to release the second strained layer 210b. Consequently, the second strained layer 210b and the second inductor portion 224b of the second patterned conductive layer 208b (as well as the optional second thermal conduction layer 216b) roll up to relieve strain in the second strained layer 210b. A second rolled-up inductor 202b is thus formed, as shown in FIG. 6M and in FIG. 2. The second rolled-up inductor 202b is connected in series with and laterally spaced apart from the third rolled-up inductor 202c.

Finally, an end of the first sacrificial layer 212a is etched to release the first strained layer 210a from the substrate 220. Consequently, the first strained layer 210a and the first inductor portion 224a of the first patterned conductive layer 208a (as well as the optional thermal conduction layer 216a) roll up to relieve strain in the first strained layer 210a. A first rolled-up inductor 202a is thus formed, as shown in FIG. 2. The first rolled-up inductor 202a is connected in series with and laterally spaced apart from the second rolled-up inductor 202b.

If, as described above, the etching of the third sacrificial layer 212c occurs prior to the etching of the second sacrificial layer 212b, and the etching of the second sacrificial layer 212b occurs prior to etching of the first sacrificial layer 212a, then the third rolled-up inductor 202c is formed prior to the second rolled-up inductor 202b, and the second rolled-up inductor 202b is formed prior to the first rolled-up inductor 202a. Thus, the method to form the rolled-up inductors in the array may be a sequential roll-up process. Alternatively, it is contemplated that the etching of the sacrificial layers 212a, 212b, 212c may be done simultaneously after formation of the multilayer sheets 206a, 206b, 206c.

Up to n multilayer sheets, where $2 \leq n \leq 100$, may be formed in the stack 204, and the array 200 may include up to n rolled-up power inductors formed in a roll-up process carried out as described above. In addition, the process may be employed to form interconnected arrays of rolled-up power inductors, such as the two arrays 400, 500 shown in FIG. 4, formed from adjacent stacks 404, 504 of multilayer sheets.

In the case of a graphene-on-diamond SiNx rolled-up power inductor, fabrication of a single inductor may include the following steps: depositing a sacrificial layer on a substrate, depositing a $SiN_X$ bilayer (strained layer) on the sacrificial layer; depositing a ultrananocrystalline diamond (UNCD) layer on the $SiN_x$ bilayer; transferring multiple-layer graphene onto the UNCD layer and patterning the multiple-layer graphene into conductive strips; and opening an etch window from one side of the sacrificial layer to enable etching and consequently controlled directional roll-up of the $SiN_x$ bilayer (with the UNCD layer and multilayer graphene thereon). It is notable that all lithography, etching and deposition steps are typically completed before rolling-up the strained bilayer to relieve strain and form the rolled-up power inductor. After fabrication, the rolled-up power inductor can readily be encapsulated without affecting the structural integrity for enhanced mechanical stability.

More generally speaking, the rolled-up power inductor comprises a multilayer sheet in a rolled configuration comprising multiple turns about a longitudinal axis, where the multilayer sheet comprises a patterned graphene layer on a strain-relieved layer (e.g., $SiN_x$) with a thermal conduction layer as set forth above therebetween. The patterned graphene layer comprises at least one graphene strip having a length extending in a rolling direction so as to wrap around the longitudinal axis in the rolled configuration, thereby forming an inductor cell of the rolled-up power inductor.

Forming the first, second, $i^{th}$ or $n^{th}$ patterned conductive layer, which may be a patterned graphene layer, may comprise depositing a conductive layer onto the respective strained layer using a deposition method known in the art, such as chemical vapor deposition (CVD), physical vapor deposition (PVD) or atomic layer deposition (ALD). Alternatively, the conductive layer may be deposited on another substrate and then transferred to the strained layer using a wet or dry transfer method, such as solution transfer or stamping. This may be beneficial if relatively high deposition temperatures (e.g., about 480° C. or up) that may detrimentally impact the strain in the strained layer are required to form the conductive layer. For example, one or more layers of graphene may be deposited on a copper foil to form a conductive layer on the copper foil, and then the conductive layer may be transferred to a $SiN_x$ strained layer in solution. Once the conductive layer is deposited or transferred onto the respective strained layer, lithography and etching methods known in the art may be employed to form the first, second, $i^{th}$ or $n^{th}$ patterned conductive layer. The method may further entail forming an electrical insulation layer on each of the patterned conductive layers.

Any through-thickness vias may be made by reactive ion beam etching or wet etching of layers deposited on the first (or $i^{th}$) conductive layer to form an air-core via (i.e., a channel). Then, the channel may be filled with an electrically conductive material by metal evaporation, electroplating, or another coating or deposition method known in the art.

The thermal conduction layer may be deposited and patterned directly on the strained layer or transferred from another substrate using methods known in the art, as described above for the conductive layer. UNCD, which may be employed as the thermal conduction layer, has a deposition temperature compatible with $SiN_x$ and CMOS. Recent progress in CVD diamond growth performed at low temperatures ($\leq 400°$ C.) can provide UNCD directly on strained $SiN_x$ with a 2-5 nm grain size and a thickness ranging from dozens of nanometers to several micrometers. Experiments have demonstrated that the maximum breakdown current density in ambient conditions for graphene-on-UNCD is as high as $18 \times 10^8$ A/cm². UNCD films (layers) are patternable and have a surface roughness that can be controllably smoothed by using a $H_2/O_2$ plasma. Although UNCD films have a large Young's modulus (700-1000 GPa), which is about twice as large as that of an $Al_2O_3$ film, the high tensile stress (0.89-5 GPa) of UNCD helps to promote roll-up.

The strained layer may be formed by deposition (e.g., CVD) and patterning methods known in the art. The strain in the strained layer may be introduced by compositional or structural differences between sublayers that are successively deposited so as to be in contact with each other. For example, adjacent contacting sublayers (e.g., top and bottom sublayers) may be formed with different lattice parameters and/or with different stoichiometries. To facilitate rolling up upon release from an underlying sacrificial layer 145 deposited on a substrate 150, the top sublayer 140a may may have a smaller lattice parameter than the bottom sublayer 140b, as shown schematically in FIG. 1A. In such a circumstance, the top sublayer 140a comprises a residual tensile stress, and the bottom sublayer 140b comprises a residual compressive stress. The residual stress profile in the sublayers 140a, 140b may be reversed (compressive on top; tensile on bottom) in order to have the rolling proceed downward, instead of upward, which is possible for any of the embodiments described herein. It is also possible that a single layer may be formed with appropriate compositional and/or structural gradients across the layer to produce the desired stress profile in the strained layer. $SiN_x$ films deposited by PECVD may differ from single crystal films in that internal strain may be developed not by crystal lattice mismatch but rather by density differences and thermal mismatch achieved by appropriate deposition conditions. In one example, an oppositely strained $SiN_x$ bilayer may be deposited successively with low frequency (375 kHz, compressive strain) and high frequency (13.56 MHz, tensile strain) PECVD conditions.

It has been demonstrated experimentally that thin films deposited by different methods or under different conditions may provide a strained layer having adjustable values of residual stress in a wide range, such as from 478 to −1100 MPa for silicon nitride ($SiN_x$) and from greater than 1000 MPa to less than −1000 MPa for metal thin films on $SiO_2$, where positive values of residual stress correspond to tensile stresses, and negative values correspond to compressive stresses. By carefully designing the residual stress mismatch in each sublayer, it is possible to generate a large enough driving force to overcome resistance and to continue rolling over a long enough distance to form as many turns as needed. To create a higher residual stress mismatch during deposition of the strained $SiN_x$ layers, for example, and thus a smaller tube diameter, the PECVD environment may be changed by adjusting a ratio of the $SiH_4$ flow rate to the $NH_3$ flow rate or by optimizing the power of the RF source.

Typically, the strained layer has a thickness of from about 2 nm to about 200 nm; however, in some embodiments (e.g., in which single crystals are used), the thicknesses may be about 1 nm or less, down to a few monolayers or to one monolayer. Generally, the thickness is at least about 5 nm, at least about 10 nm, at least about 20 nm, at least about 30 nm, at least about 40 nm, or at least about 50 nm. The thickness may also be no more than about 200 nm, no more than about 150 nm, no more than about 100 nm, no more than about 80 nm, no more than about 60 nm, or no more than about 40 nm. When a large number of turns is required and the strained layer includes two oppositely strained sublayers (a bilayer), it may be advantageous for the sublayers to have the same thickness.

The sacrificial layer may comprise a material that can be etched without removing or otherwise damaging the strained layer. For example, single-crystalline and/or polycrystalline Ge, $GeO_x$, Si, and AlAs, as well as photoresist, may be used as a sacrificial layer. In one example, a strained bilayer comprising InAs/GaAs may be formed on a sacrificial layer comprising AlAs that may be etched away with hydrofluoric acid (HF). In another example, a strained bilayer comprising $SiN_x$ may be formed on a sacrificial layer comprising Ge that may be etched away with hydrogen peroxide. Deposition and patterning methods known in the art may be employed to form the sacrificial layer.

Each of the rolled-up power inductors fabricated as described above may have a length along the longitudinal axis that depends on the number and size of the inductor cells. Typically, the length is at least about 10 microns, at least about 50 microns, at least about 100 microns, at least about 200 microns, or at least about 500 microns, and the length may also be about 8000 microns or less, about 5000 microns or less, or about 1000 microns or less. For example, the length may range from about 10 microns to about 8000 microns, or from about 100 microns to about 3000 microns, or from about 300 microns to about 1000 microns.

In addition, each of the rolled-up power inductors may have a diameter (inner diameter) from about 1 micron to about 1000 microns, or from about 5 microns to about 500 microns. Typically, the inner diameter is no more than about 500 microns, no more than about 300 microns, or no more than about 100 microns. The inner diameter may also be at least about 1 micron, at least about 5 microns, or at least about 10 microns. The inner diameter of the rolled-up power inductor depends on the thickness of the multilayer sheet as well as the amount of strain in the strained layer prior to release of the sacrificial layer. A thicker multilayer sheet may tend to roll to a larger inner diameter; however, a higher level of strain in the strained layer can offset this effect, since the inner diameter (D) of the rolled configuration is proportional to the thickness (t) of the multilayer sheet and is inversely proportional to the amount of strain ($\varepsilon$) therein ($D \propto t/\varepsilon$).

Using a transient FEM model, the inner diameter of a rolled-up power inductor is simulated to be 25 μm if a 20 nm UNCD thermal conduction layer is grown on a 40 nm $SiN_x$ strained layer, as shown in FIG. 7. It is assumed that the UNCD thermal conduction layer has a 700 GPa Young's modulus and a 0.89 GPa tensile stress, and the $SiN_x$ strained layer has a 210 GPa Young's modulus, with a −1133 MPa compressive stress for the low-frequency deposited $SiN_x$ sublayer and a 387 MPa tensile stress for the high-frequency deposited $SiN_x$ sublayer.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

What is claimed is:

1. An array of rolled-up power inductors for on-chip applications, the array comprising:
   at least two rolled-up power inductors connected in series and formed from a stack of multilayer sheets, the at least two rolled-up power inductors comprising:
   a first rolled-up power inductor comprising a first multilayer sheet in a rolled configuration about a first longitudinal axis, the first multilayer sheet comprising a first patterned conductive layer on a first strain-relieved layer,
a second rolled-up power inductor comprising a second multilayer sheet in a rolled configuration about a second longitudinal axis, the second rolled-up power inductor being laterally spaced apart from the first rolled-up power inductor, the second multilayer sheet comprising a second patterned conductive layer on a second strain-relieved layer,
wherein, prior to roll-up of the second and first multilayer sheets, the second multilayer sheet is disposed on the first multilayer sheet, and a through-thickness first via connects the second patterned conductive layer with the first patterned conductive layer, thereby enabling, after the roll-up, a series connection of the first and second rolled-up power inductors.

2. The array of claim 1, wherein the first and second patterned conductive layers comprise graphene, the first and second patterned conductive layers being first and second patterned graphene layers.

3. The array of claim 2, wherein each of the first and second patterned graphene layers comprises multi-layer graphene having from two to 20 atomic layers.

4. The array of claim 1, further comprising a first thermal conduction layer between the first patterned conductive layer and the first strain-relieved layer, and
further comprising a second thermal conduction layer between the second patterned conductive layer and the second strain-relieved layer.

5. The array of claim 4, wherein the first and second thermal conduction layers comprise a material selected from the group consisting of: diamond, boron nitride, graphite, carbon nanotubes, silicene, and a transition metal dichalcogenide.

6. The array of claim 1, wherein the first and second strain-relieved layers comprise $SiN_x$, where $0.5 \leq x \leq 1.5$.

7. The array of claim 1, wherein the rolled configuration of the first multilayer sheet and the rolled configuration of the second multilayer sheet each comprises multiple turns about the respective longitudinal axis, the multiple turns being in a range from 5 turns to 500 turns.

8. The array of claim 1, wherein a lateral spacing of the first and second rolled-up power inductors is no greater than about 250 microns.

9. The array of claim 1, wherein the first and second rolled-up power inductors are disposed substantially parallel to each other on a substrate.

10. The array of claim 1, wherein the at least two rolled-up power inductors further include a third rolled-up power inductor comprising a third multilayer sheet in a rolled configuration about a third longitudinal axis, the third rolled-up power inductor being adjacent to and laterally spaced apart from the second rolled-up power inductor, the third multilayer sheet comprising a third patterned conductive layer on a third strain-relieved layer,
wherein, prior to roll-up of the third multilayer sheet, the third multilayer sheet is disposed on the second multilayer sheet, and a through-thickness second via connects the third patterned conductive layer with the second patterned conductive layer, thereby enabling, after the roll-up, a series connection of the second and third rolled-up power inductors.

11. The array of claim 1 comprising a total inductance of at least about 1 µH.

12. A rolled-up power inductor for on-chip applications, the rolled-up power inductor comprising:
a multilayer sheet in a rolled configuration comprising multiple turns about a longitudinal axis, the multilayer sheet comprising:
a patterned graphene layer on a strain-relieved layer with a thermal conduction layer therebetween, the patterned graphene layer comprising at least one graphene strip having a length extending in a rolling direction so as to wrap around the longitudinal axis in the rolled configuration, thereby forming an inductor cell of the rolled-up power inductor.

13. The rolled-up power inductor of claim 12, wherein the thermal conduction layer comprises a material selected from the group consisting of diamond, boron nitride, graphite, carbon nanotubes, silicene, and a transition metal dichalcogenide.

* * * * *